US012701984B2

(12) United States Patent
Vega et al.

(10) Patent No.: US 12,701,984 B2
(45) Date of Patent: Aug. 4, 2026

(54) SELF-ALIGNED VIA IN DOUBLE DIFFUSION BREAK TO CONNECT TO BACKSIDE INTERCONNECTS

(71) Applicant: INTERNATIONAL BUSINESS MACHINES CORPORATION, Armonk, NY (US)

(72) Inventors: Reinaldo Vega, Mahopac, NY (US); Ruilong Xie, Niskayuna, NY (US); Nicholas Anthony Lanzillo, Wynantskill, NY (US); Albert M. Chu, Nashua, NH (US); Lawrence A. Clevenger, Saratoga Springs, NY (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 570 days.

(21) Appl. No.: 18/182,412

(22) Filed: Mar. 13, 2023

(65) Prior Publication Data

US 2024/0312912 A1     Sep. 19, 2024

(51) Int. Cl.
| | |
|---|---|
| *H10W 20/41* | (2026.01) |
| *H10D 30/00* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2026.01) |
| *H10D 84/03* | (2025.01) |
| *H10D 84/83* | (2025.01) |
| *H10D 84/85* | (2025.01) |

(52) U.S. Cl.
CPC ........ *H10W 20/427* (2026.01); *H10D 30/019* (2025.01); *H10D 30/43* (2025.01); *H10D 30/501* (2025.01); *H10D 30/6735* (2025.01); *H10D 62/121* (2025.01); *H10D 84/0186* (2025.01); *H10D 84/038* (2025.01); *H10D 84/832* (2025.01); *H10D 84/85* (2025.01); *H10D 84/851* (2025.01)

(58) Field of Classification Search
CPC ........ H10D 30/019–0197; H10D 30/501–509; H10D 84/832; H10D 84/851
See application file for complete search history.

(56) References Cited

U.S. PATENT DOCUMENTS

| | | | |
|---|---|---|---|
| 3,962,052 | A | 6/1976 | Abbas |
| 5,811,868 | A | 9/1998 | Bertin |
| 5,814,889 | A | 9/1998 | Gaul |
| 5,998,292 | A | 12/1999 | Black |
| 6,198,168 | B1 | 3/2001 | Geusic |

(Continued)

*Primary Examiner* — Kevin Parendo
(74) *Attorney, Agent, or Firm* — Samuel A. Waldbaum

(57) ABSTRACT

A microelectronic structure including a plurality of nanosheet transistors. Each of the plurality of nanosheet transistors includes an active gate located around a plurality of active channel layers and each of the plurality of nanosheet transistors includes a source/drain region have a first length. The first length is measured perpendicular to a gate direction of the plurality of nanosheet transistors. A power via located between a first dummy device and a second dummy device and the power via has second length. The second length is measured perpendicular to a gate direction of the plurality of nanosheet transistors. The second length is larger than the first length.

17 Claims, 24 Drawing Sheets

CROSS- SECTION X

(56)                    References Cited

U.S. PATENT DOCUMENTS

| | | |
|---|---|---|
| 7,276,787 B2 | 10/2007 | Edelstein |
| 7,935,571 B2 | 5/2011 | Ramiah |
| 8,276,002 B2 | 9/2012 | Dennard |
| 8,344,512 B2 | 1/2013 | Knickerbocker |
| 8,445,918 B2 | 5/2013 | Bartley |
| 10,388,519 B2 | 8/2019 | Smith |
| 10,586,765 B2 | 3/2020 | Smith |
| 10,636,739 B2 | 4/2020 | Beyne |
| 10,797,139 B2 | 10/2020 | Morrow |
| 10,833,089 B2 | 11/2020 | Pille |
| 10,985,064 B2 | 4/2021 | Zhang |
| 11,056,487 B2 | 7/2021 | Yang |
| 11,437,379 B2 | 9/2022 | Song |
| 11,817,394 B2 | 11/2023 | Farooq et al. |
| 12,046,643 B2 | 7/2024 | Frougier et al. |
| 12,136,655 B2 | 11/2024 | Xie et al. |
| 2018/0145030 A1 | 5/2018 | Beyne |
| 2018/0218973 A1 | 8/2018 | Nelson |
| 2019/0164882 A1 | 5/2019 | Chen et al. |
| 2020/0105671 A1 | 4/2020 | Lai |
| 2020/0266169 A1 | 8/2020 | Kang |
| 2020/0373242 A1 | 11/2020 | Hiblot |
| 2020/0373402 A1* | 11/2020 | Yang ................... H10D 62/113 |
| 2021/0104435 A1 | 4/2021 | Son |
| 2021/0111115 A1 | 4/2021 | Morrow |
| 2021/0118798 A1 | 4/2021 | Liebmann |
| 2021/0134721 A1 | 5/2021 | Chiang |
| 2021/0202385 A1 | 7/2021 | Huang |
| 2021/0202472 A1 | 7/2021 | Thomson |
| 2021/0296234 A1 | 9/2021 | Dechene |
| 2021/0343696 A1 | 11/2021 | Chae |
| 2022/0068815 A1 | 3/2022 | Vadi |
| 2022/0102266 A1 | 3/2022 | Lim |
| 2022/0181258 A1 | 6/2022 | Liebmann |
| 2022/0301878 A1 | 9/2022 | Xie |
| 2023/0128985 A1 | 4/2023 | Anderson et al. |
| 2023/0131382 A1* | 4/2023 | Ding ...................... H01L 25/16 |
| | | 257/211 |
| 2023/0369222 A1* | 11/2023 | Engel .................. H10D 30/014 |
| 2024/0178136 A1 | 5/2024 | Xie et al. |

* cited by examiner

TOP DOWN VIEW

CROSS- SECTION X

CROSS- SECTION Y

CROSS- SECTION Y

CROSS- SECTION X

CROSS- SECTION Y

CROSS- SECTION X

CROSS- SECTION X

CROSS- SECTION X

CROSS- SECTION Y

CROSS- SECTION X

CROSS- SECTION X

CROSS- SECTION Y

CROSS- SECTION X

CROSS- SECTION Y

CROSS- SECTION X

CROSS- SECTION Y

CROSS- SECTION X

CROSS- SECTION Y

CROSS- SECTION X

CROSS- SECTION Y

TOP DOWN VIEW

CROSS- SECTION X

CROSS- SECTION Y

1

SELF-ALIGNED VIA IN DOUBLE DIFFUSION BREAK TO CONNECT TO BACKSIDE INTERCONNECTS

BACKGROUND

The present invention generally relates to the field of microelectronics, and more particularly to formation of a double diffusion breaks.

Nanosheet is the lead device architecture in continuing CMOS scaling. However, nanosheet technology has shown issues when scaling down such that as the devices become smaller and closer together, they are interfering with each other. With the number of devices being fit in a smaller area it is becoming harder to form to separate the components and form the necessary connections.

BRIEF SUMMARY

Additional aspects and/or advantages will be set forth in part in the description which follows and, in part, will be apparent from the description, or may be learned by practice of the invention.

A microelectronic structure including a plurality of nanosheet transistors. Each of the plurality of nanosheet transistors includes an active gate located around a plurality of active channel layers and each of the plurality of nanosheet transistors includes a source/drain region have a first length. The first length is measured perpendicular to a gate direction of the plurality of nanosheet transistors. A power via located between a first dummy device and a second dummy device and the power via has second length. The second length is measured perpendicular to the gate direction of the plurality of nanosheet transistors. The second length is larger than the first length.

A microelectronic structure including a plurality of nanosheet transistors. Each of the plurality of nanosheet transistors includes an active gate located around a plurality of active channel layers, and each of the plurality of nanosheet transistors includes a source/drain region having a first length. The first length is measured perpendicular to a gate direction of the plurality of nanosheet transistors. A power via located between a first dummy device and a second dummy device, where the power via has second length. The second length is measured perpendicular to a gate direction of the plurality of nanosheet transistors. The second length is larger than the first length. The first dummy device is located flush against a first side of the power via and the second dummy device is located flush against a second side of the power via.

A method including forming a plurality nanosheet transistors, where each of the plurality of nanosheet transistors includes an active gate located around a plurality of channel layers, and each of the plurality of nanosheet transistors includes a source/drain region having a first length. The first length is measured perpendicular to a gate direction of the plurality of nanosheet transistors. Forming a trench in the source/drain region located between two adjacent nanosheet transistors. The trench removes the source/drain region causing the formation of a first dummy device and a second dummy device. Recessing channel layers of the first and second dummy device, where the distance between the gate of the first dummy device and the gate of the second dummy device is a first distance. The first distance is measured perpendicular to a gate direction of the plurality of nanosheet transistors and the first distance is larger than the first length.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
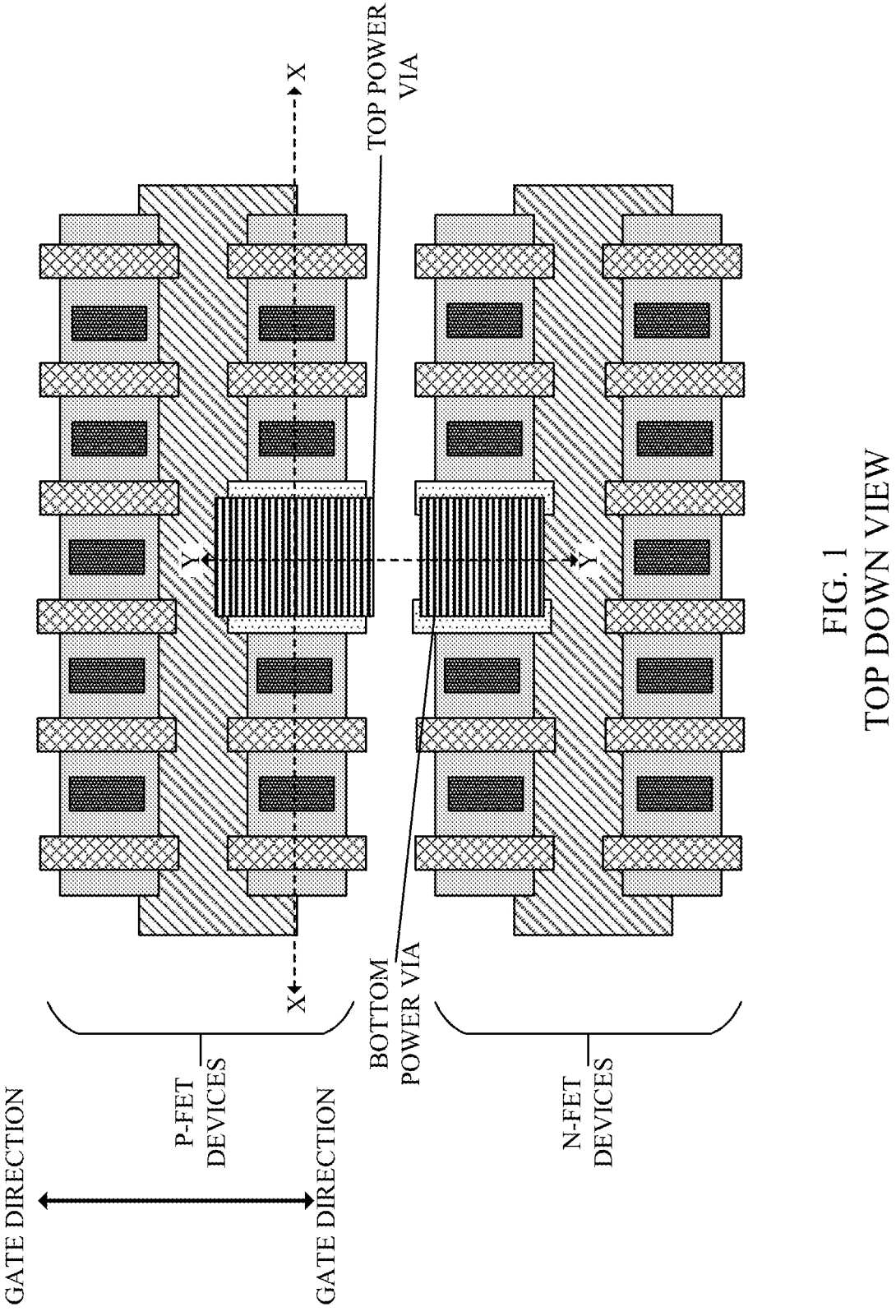
FIG. 1 illustrates a top-down view of multiple nano devices/nanosheet transistors, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising,"

"includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout.

Typically, the backside-power-distribution-network (BSPDN) Power Via exists in N-N or P-P space at north/south cell boundaries. This restricts Power Via critical dimensions (CD) within N-N, P-P space due to shorts margin requirements between Power Via and PC corner.

The present invention trades a single diffusion break (SDB) for a double diffusion break (DDB) and forming the power via in the DDB region. The Power Via etch is self-aligned, using AUXPC (post-RMG) as self-alignment assist feature. The Power Via located in the double diffusion break region is larger than a power via located in a single diffusion break region, thus causing the power via of the present invention having a lower resistance. The power via of the present invention can have 3.5× to 12× resistance reduction when compared to a power via located in a single diffusion break. The power via can be formed as separate elements as illustrated by the figure, or the power via can extend across the PFET and NFET devices as a single component.

FIG. 1 illustrates a top-down view of multiple devices, in accordance with the embodiment of the present invention. The cross-section X extends horizontally through the nano stacks of one of the devices. Cross section Y is perpendicular to cross section X, where cross section Y is through a source/drain region that spans across multiple nano stacks. FIG. 1 illustrates two different power vias having different characteristics. The top power via has a width, as measured in parallel with the gate direction, that is larger than the width of the device/transistor as measured in the parallel with the gate direction. The bottom power via a width, as measured in parallel with the gate direction, that is smaller or equal to the width of the device/transistor as measured in the parallel with the gate direction. The present invention can have one type of power via, or a combination of types of power via.

Figure 2:
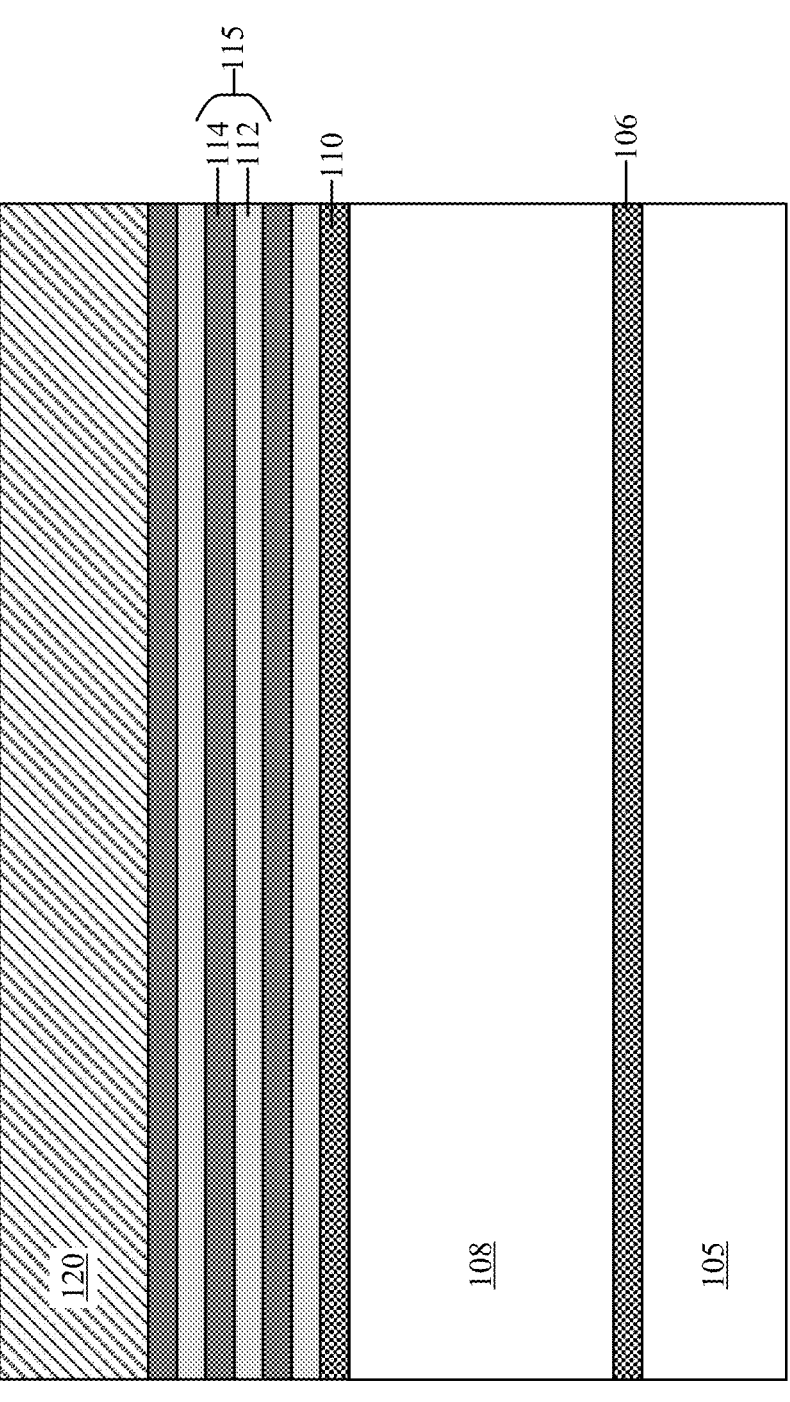
FIG. 2 illustrates a cross section X of the nano stack after the formation of the alternating layers to form one of the devices, in accordance with the embodiment of the present invention.
Figure 3:
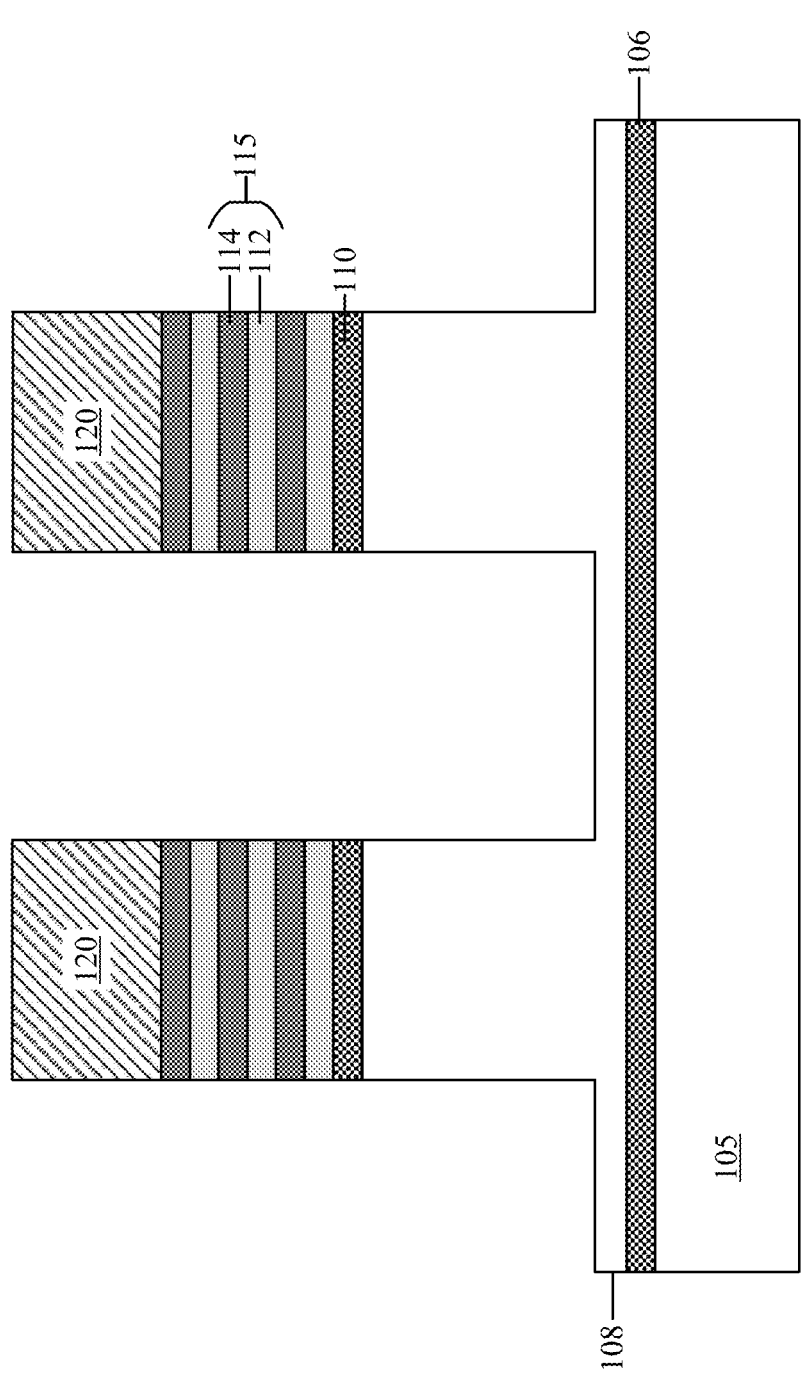
FIG. 3 illustrates a cross section Y of the source/drain region after the etching of the alternating layers to form the separate columns, in accordance with the embodiment of the present invention.

FIGS. 2, and 3 illustrate the processing stage after the etching of the alternating layers to form the separate columns. FIG. 2 illustrates the alternating layers 115 formed on top of a first sacrificial layer 110, a second substrate 108, an etch stop 106, and a first substrate 105.

The first substrate 105 and the second substrate 108 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the first substrate 105 and the second substrate 108. In some embodiments, first substrate 105 and the second substrate 108 includes both semiconductor materials and dielectric materials. The semiconductor first substrate 105 and the second substrate 108 may also comprise an organic semiconductor or a layered semiconductor such as, for example, Si/SiGe, a silicon-on-insulator or a SiGe-on-insulator. A portion or the entire semiconductor first substrate 105 and the second substrate 108 may also be comprised of an amorphous, polycrystalline, or monocrystalline. The semiconductor first substrate 105 and the second substrate 108 may be doped, undoped or contain doped regions and undoped regions therein.

The first sacrificial layer 110 can be comprised of SiGe, where Ge is in the range of about 45% to 70%. Alternating layers 115 includes a plurality of channel layers 114 (nano sheets) and a plurality of sacrificial layers 112. The alternating layers 115 are located on top of the first sacrificial layer 110. The plurality of sacrificial layers 112 can be comprised of SiGe, where Ge is in the range of about 15% to 35%. The plurality of channel layers 114 can be comprised of, for example, Si. The difference in concentration of Ge in the plurality of sacrificial layers 112 and the first sacrificial layer 110, allows for the selective targeting and removal of the first sacrificial layer 110 while leaving the plurality of sacrificial layers 112 alone.

FIG. 3 illustrates the alternating layers 115 after etching the layers into a plurality of different columns. A hardmask 120 is formed on top layer, where the top layer can be either a channel layer 114 (as shown) or a sacrificial layer 112. FIG. 3 only illustrates two columns being formed for simplicity reasons. FIG. 1 illustrates that four columns would be formed, but this is not meant to be seen as limiting. The number of columns being formed can be as few as one or as many as a plurality based on the design for the device. The etching process to form the columns removes a portion of the second substrate 108 to form a plurality of trenches that separates each of the columns as illustrated by FIG. 3.

Figure 4:
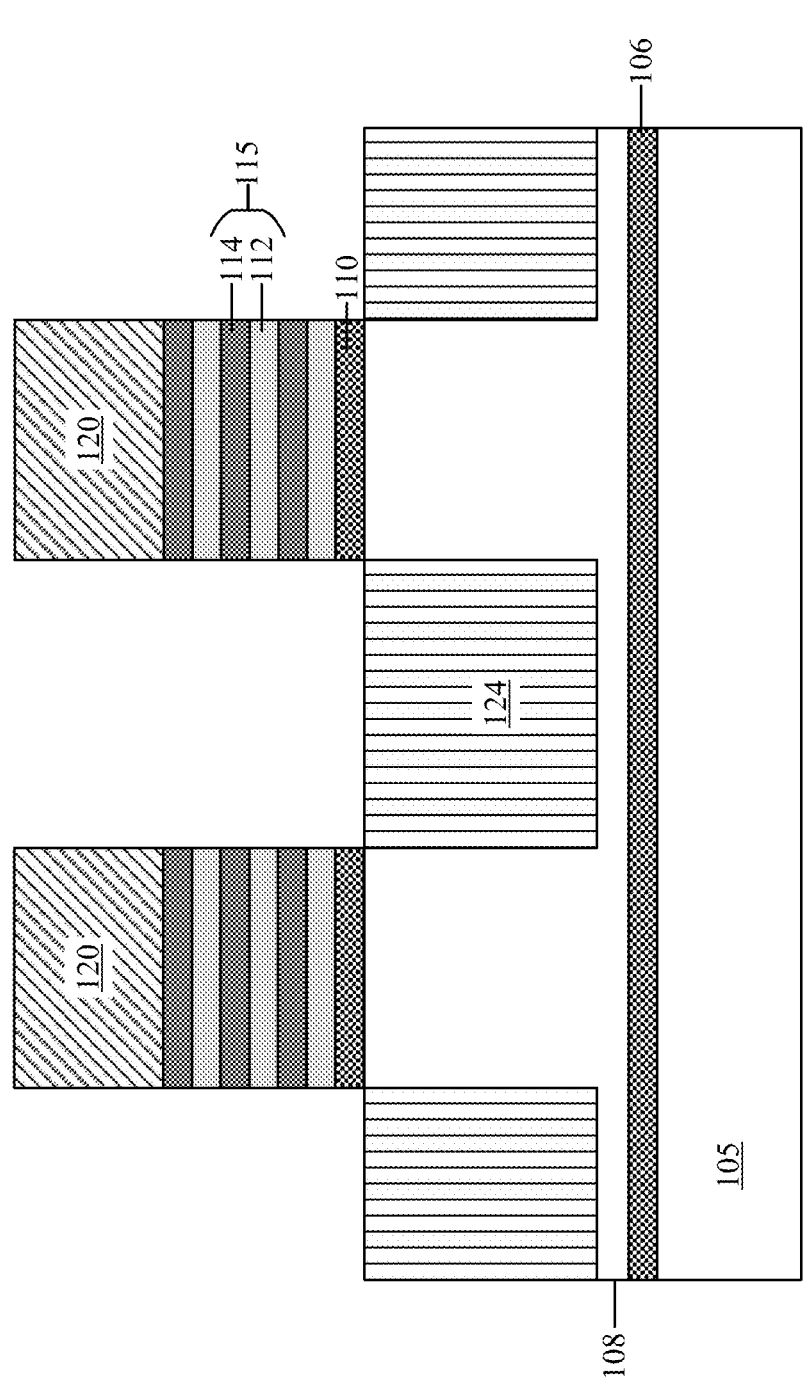
FIG. 4 illustrates a cross section Y of the source/drain region after the removal of the hardmask and the formation of a shallow trench isolation layer, in accordance with the embodiment of the present invention.

FIG. 4 illustrates the processing stage after the removal of the hardmask 120 and the formation of a shallow trench isolation layer 124. A shallow trench isolation layer 124 is formed in the trenches in the second substrate 108 that were formed during the etching of the alternating layers 115, followed by removal of hardmask 120.

Figure 5:
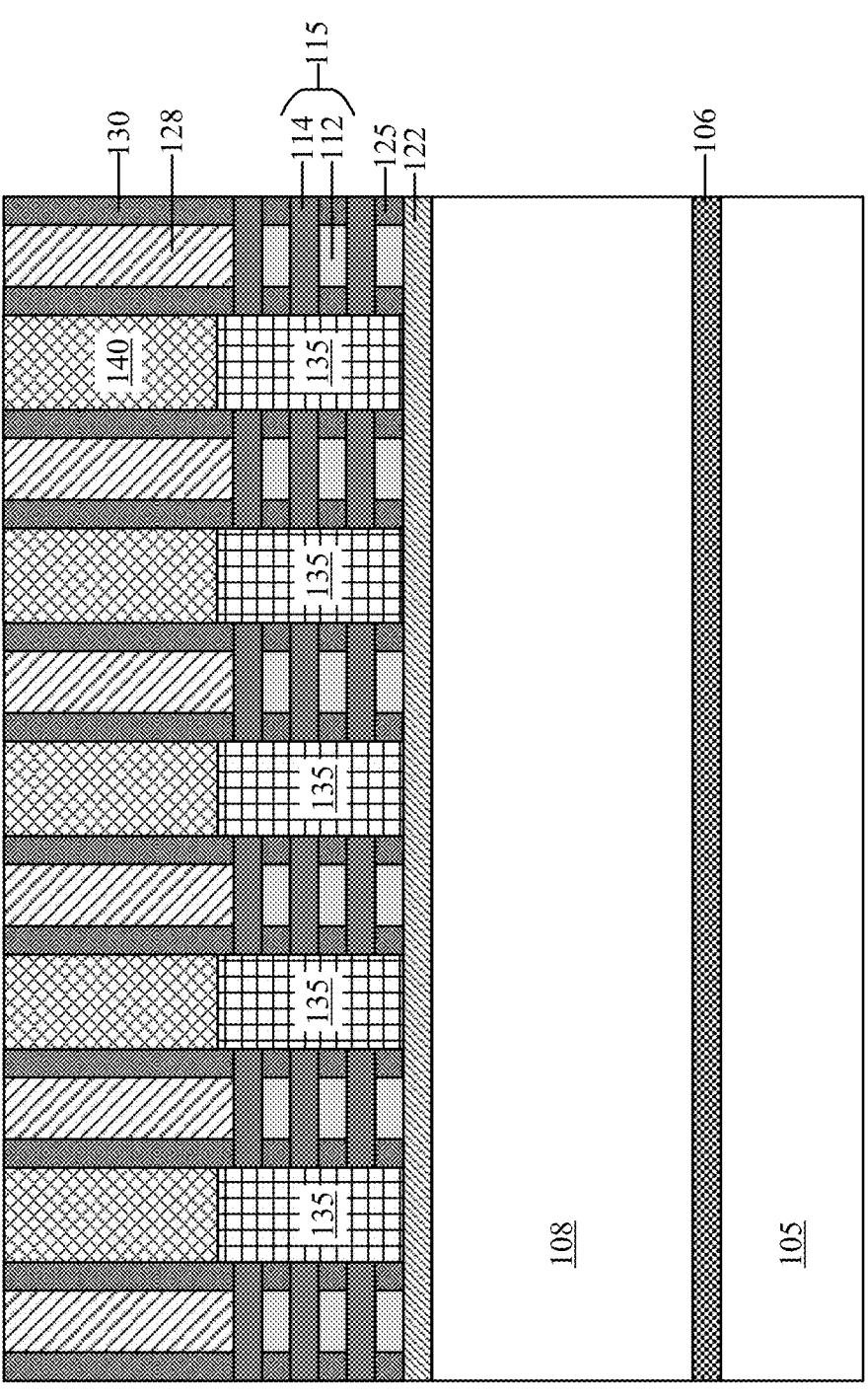
FIG. 5 illustrates a cross section X of the nano stack after the formation of the formation of a plurality nano columns, inner spacers, a plurality of source/drains, and a interlayer dielectric layer, in accordance with the embodiment of the present invention.
Figure 6:
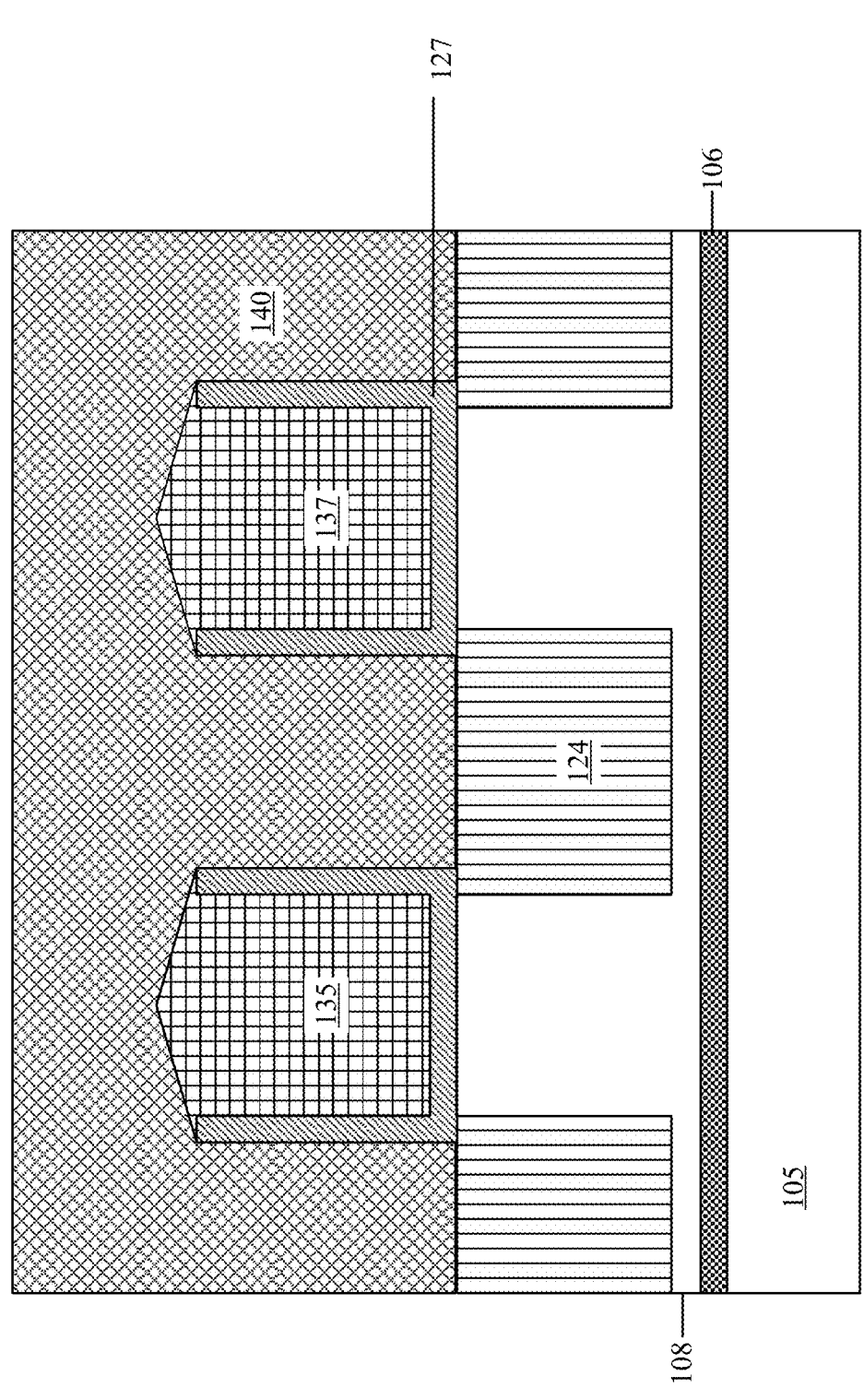
FIG. 6 illustrates a cross section Y of the source/drain region after formation of the formation of a plurality nano columns, inner spacers, a plurality of source/drains, and an interlayer dielectric layer, in accordance with the embodiment of the present invention.

FIGS. 5, and 6 illustrate the processing stage after formation of the formation of a plurality nano columns, inner spacers 125, a plurality of source/drains 135, 137, and a interlayer dielectric layer 140. The first sacrificial layer 110 is selectively removed to create a space for the formation of the bottom dielectric isolation layer 122. The first sacrificial layer 110 can be selectively removed because of the higher concentration of Ge when compared to the sacrificial layers 112. A dummy gate 128 is formed on top of the top layer of the alternating layers 115 and the dummy gate 128 is etched to form a plurality of columns. An upper spacer 130 is formed on top of the top layer of the alternating layer 115 and adjacent to the columns of the dummy gate 128. The alternating layers 115 are etched to form a plurality of columns as illustrated by FIG. 5. The plurality of sacrificial layers 112 are recessed back to create an empty space, where the empty space is filled in with an inner spacer 125. A first source/drain 135 is epitaxially grown between each of the columns as illustrated in FIG. 5, and an interlayer dielectric layer 140 is formed on top of the source/drain 135. FIG. 6 illustrates that spacer 127 comprised of the bottom dielectric layer 122 and the inner spacer 125, form some of the boundaries of the first source/drain 135 and a second source/drain 137.

The first source/drain 135 and second source/drain 137 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 7:
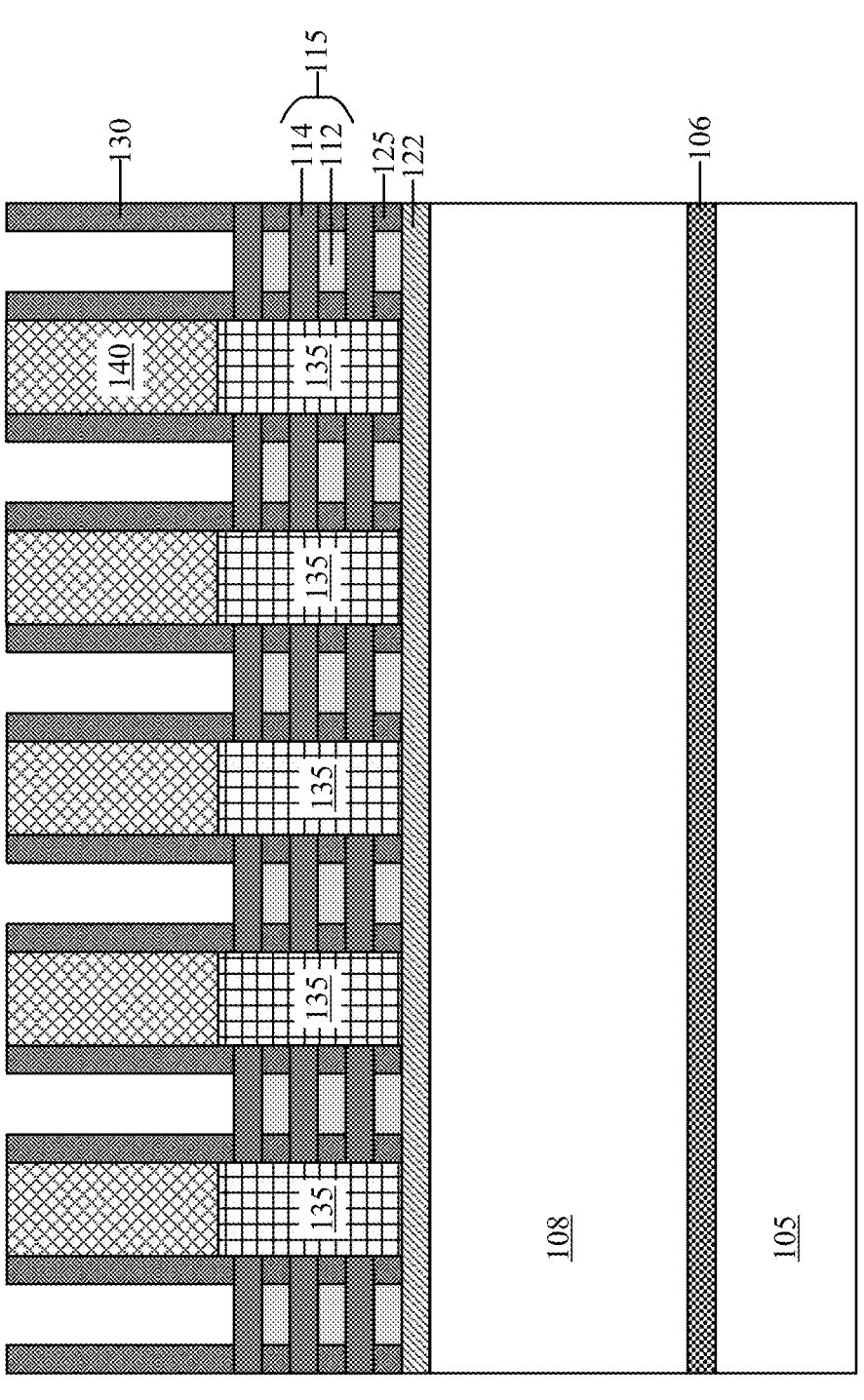
FIG. 7 illustrates a cross section X of the nano stack after the removal of the dummy gate, in accordance with the embodiment of the present invention.
Figure 8:
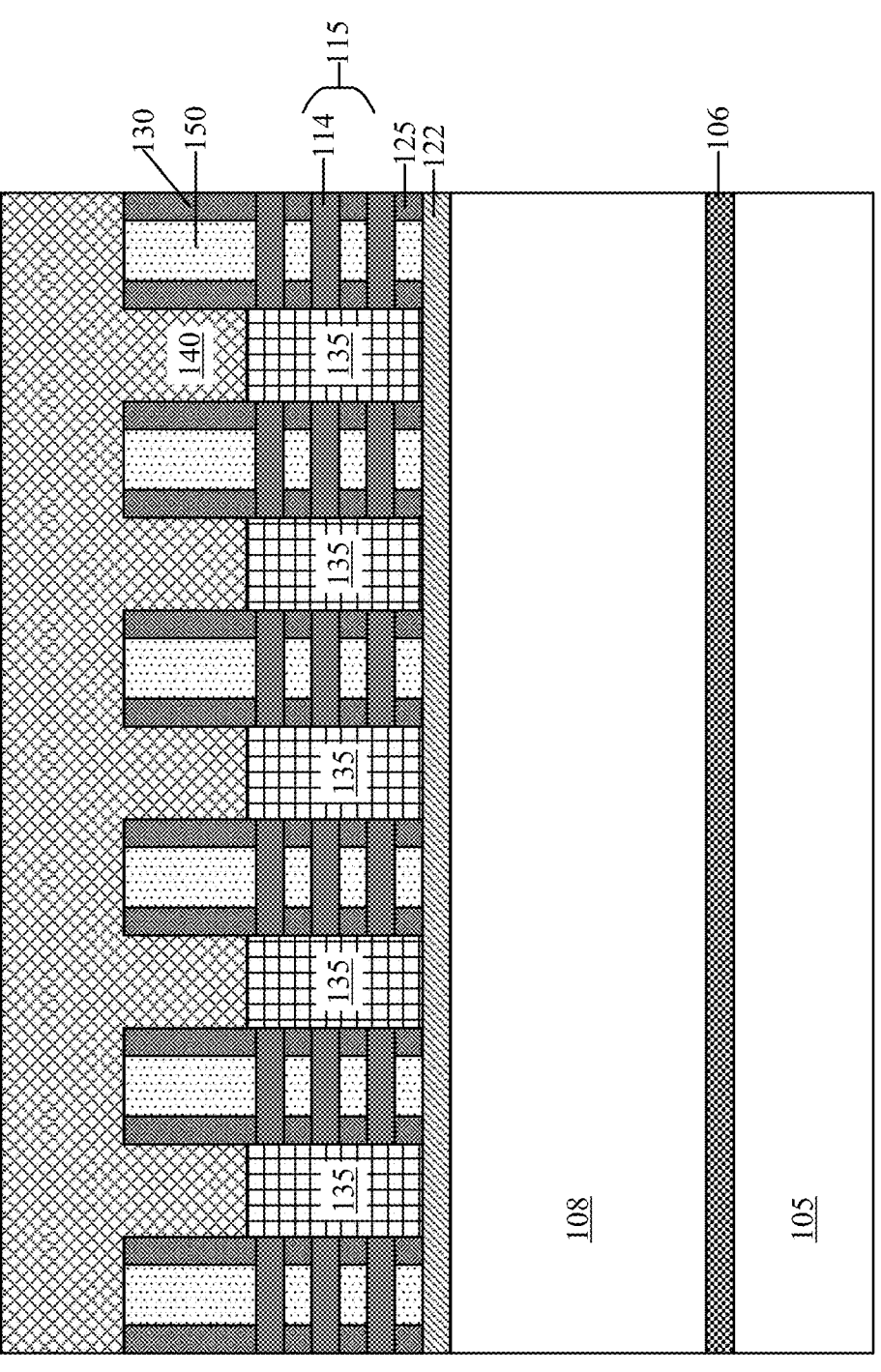
FIG. 8 illustrates a cross section X of the nano stack after the removal of the sacrificial layers and the formation of the gate, in accordance with the embodiment of the present invention.

FIG. 7 illustrates the processing stage after the removal of the dummy gate 128 and FIG. 8 illustrates the processing stage after the removal of the sacrificial layers 112 and the formation of the gate 150. The dummy gate 128 is removed to expose the top layer of the alternating layers 115 an create a space between sections of the upper spacer 130. The plurality of sacrificial layers 112 are removed to create an empty space around the channel layers 114 of the alternating layers 115. The empty space created by the removal of the dummy gate 128 and the sacrificial layers 112 is filled with a gate 150 material. The gate 150 can be comprised of, for example, a gate dielectric liner, such as high-k dielectric like $HfO_2$, $ZrO_2$, $HfL_aO_x$, etc., and work function layers, such as TIN, TiAlC, TiC, etc., and conductive metal fills, like W. The gate 150 is located on top of the top channel layer 114, where the gate 150 is located between two segments/sections of the upper spacer 130. Additional interlayer dielectric layer 140 material is deposited so that the interlayer dielectric layer 140 extends over the top of the gate 150 and the upper spacer 130.

Figure 9:
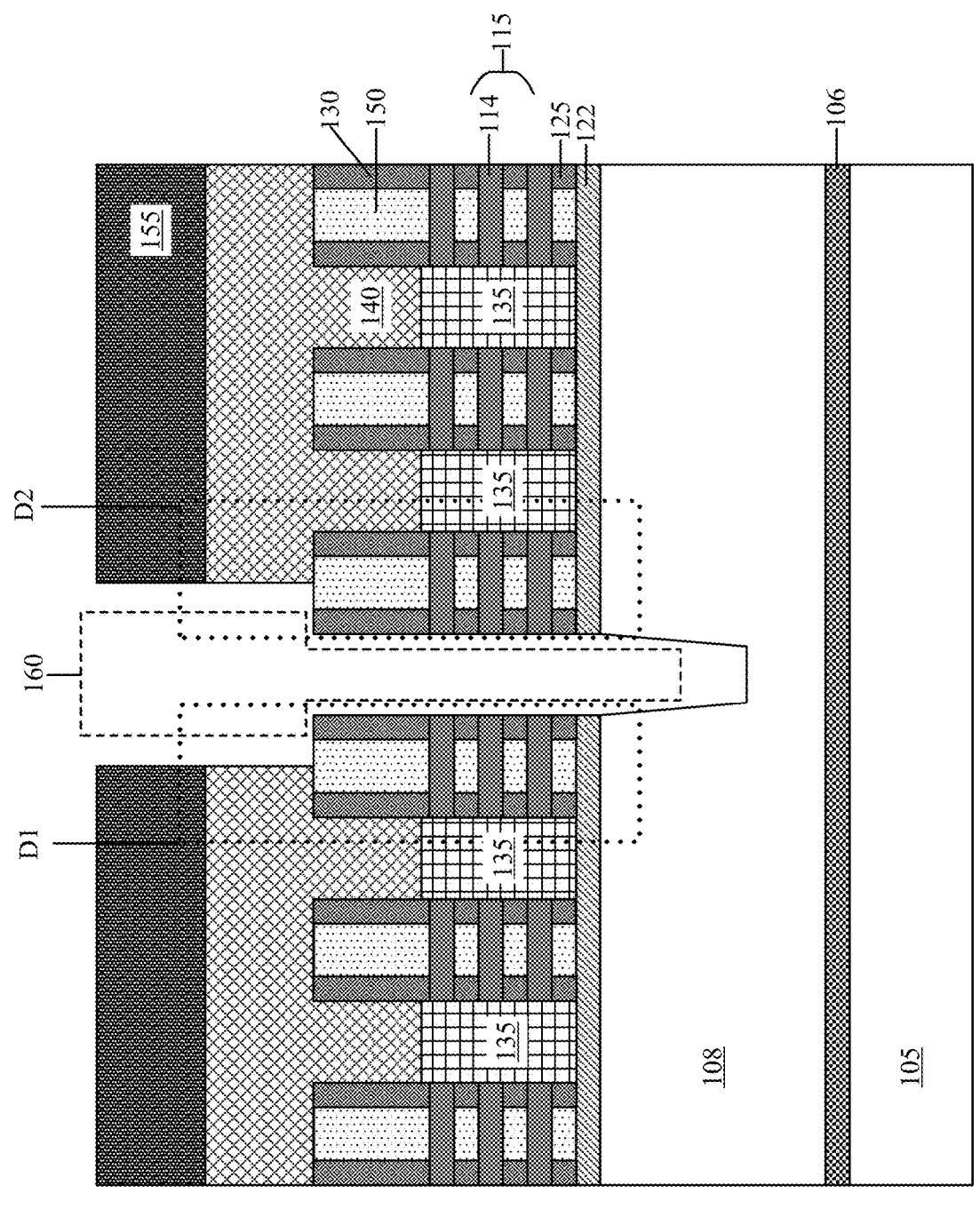
FIG. 9 illustrates a cross section X of the nano stack after the formation of the formation the double diffusion break trenches, in accordance with the embodiment of the present invention.
Figure 10:
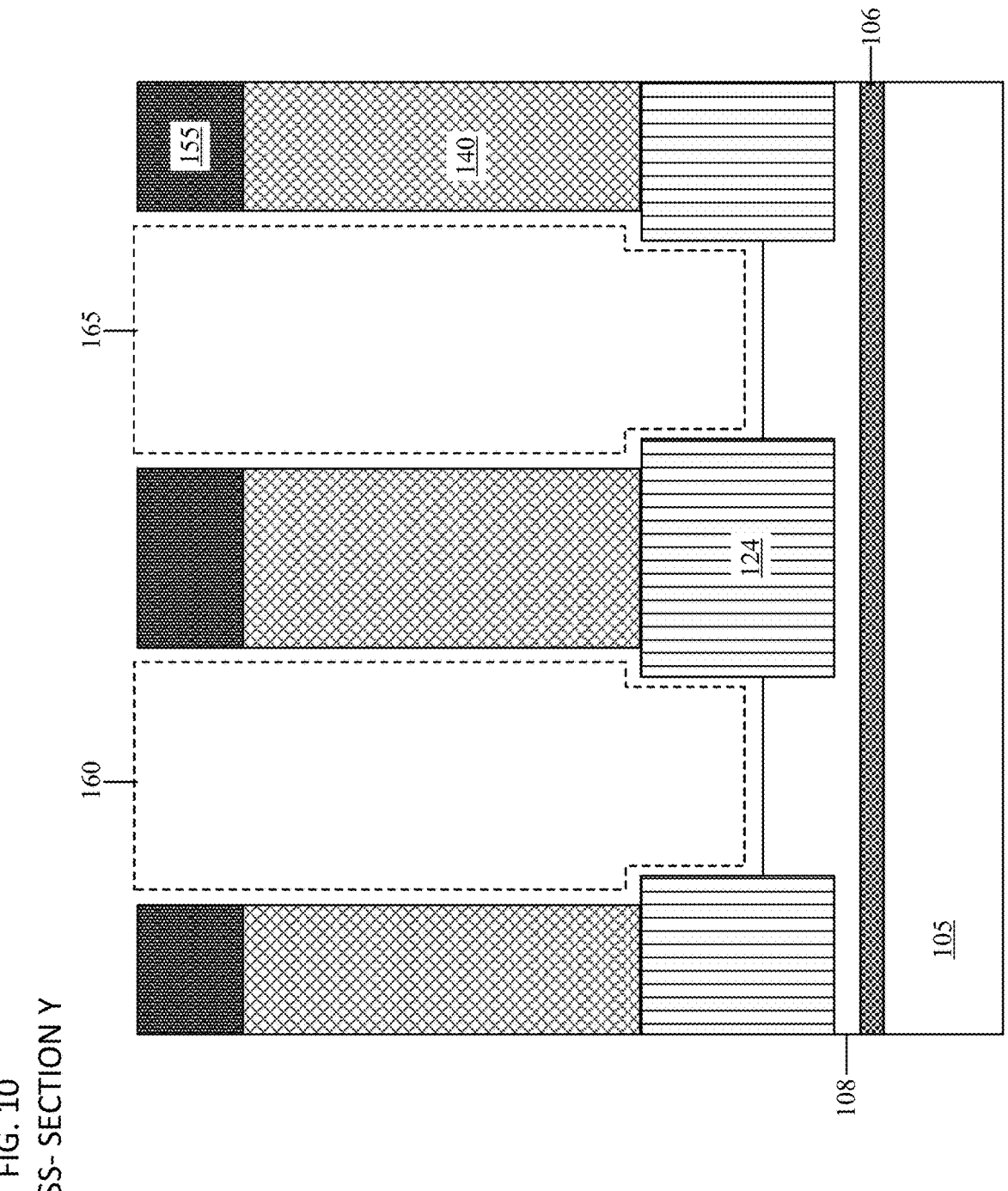
FIG. 10 illustrates a cross section Y of the source/drain region after formation the double diffusion break trenches, in accordance with the embodiment of the present invention.

FIGS. 9, and 10 illustrate the processing stage after forming the double diffusion break trenches 160 and 165. A lithography layer 155 is formed on top of the interlayer dielectric layer 140. The lithography layer 155, the interlayer dielectric layer 140, one or more of the first source/drains 135, the second source/drain 137, the bottom dielectric isolation layer 122, and the second substrate 108 are patterned/etched to form a first double diffusion break trench 160 and a second double diffusion break trench 165 as illustrated in FIGS. 9 and 10. The first double diffusion break trench 160 exposes a sidewall of adjacent nano columns as illustrated in FIG. 9. The first double diffusion break trench 160 is comprised of a top section, a middle section, and a bottom section. The top section is the portion of the first double diffusion break trench 160 located above the gate 150 and the middle section is located between the nano columns. The bottom section of the first double diffusion break trench 160 extends in to the second substrate 108. FIG. 10 illustrates the first double diffusion break trench 160 and the second double diffusion break trench 165 where a section of interlayer dielectric layer 140 is located between the two trenches. The formation of the first double diffusion break trench 160 causes the formation of a first dummy device D1 and a second dummy device D2. The illustrated Figures show two separate double diffusion break trenches 160 and 165, but this is not meant to be seen as limiting. Alternatively, a shared diffusion break trench (not shown) can be formed across the shallow trench isolation layer 124, e.g., the double diffusion break trenches 160 and 165 are merged to form a single double diffusion break. The design of the chip will determine if an induvial double diffusion break trench, a plurality double diffusion break trenches, a shared double diffusion break trench, or a combination thereof are created.

Figure 11:
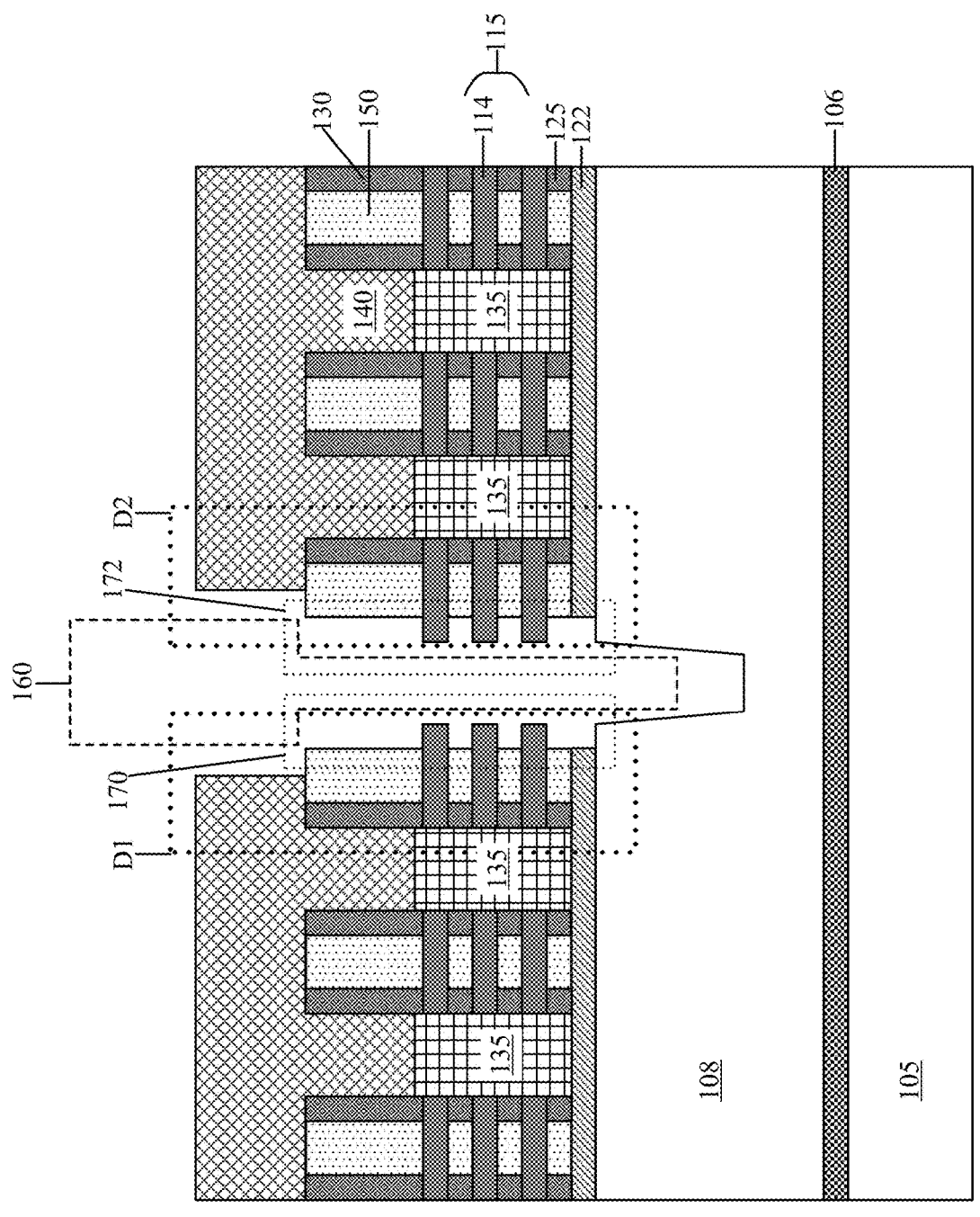
FIG. 11 illustrates a cross section X of the nano stack after the removal of upper spacer segment and segments of the inner spacer, in accordance with the embodiment of the present invention.

FIG. 11 illustrate the processing stage after the removal of segments of the upper spacer 130 and segments of the inner spacer 125. Segments of the upper spacer 130 that were exposed by the first double diffusion break trench 160 are removed to expose a portion of the gate 150 as emphasized by dashed boxes 170, 172. The inner spacer 125 that were exposed by the first double diffusion break trench 160 are removed to expose area around the end portion of that channel layers 114 as emphasized by dashed boxes 170, 172. At this stage, the channel layers 114 extends past the sidewall of the gate 150 as emphasized by dashed boxes 170, 172.

Figure 12:
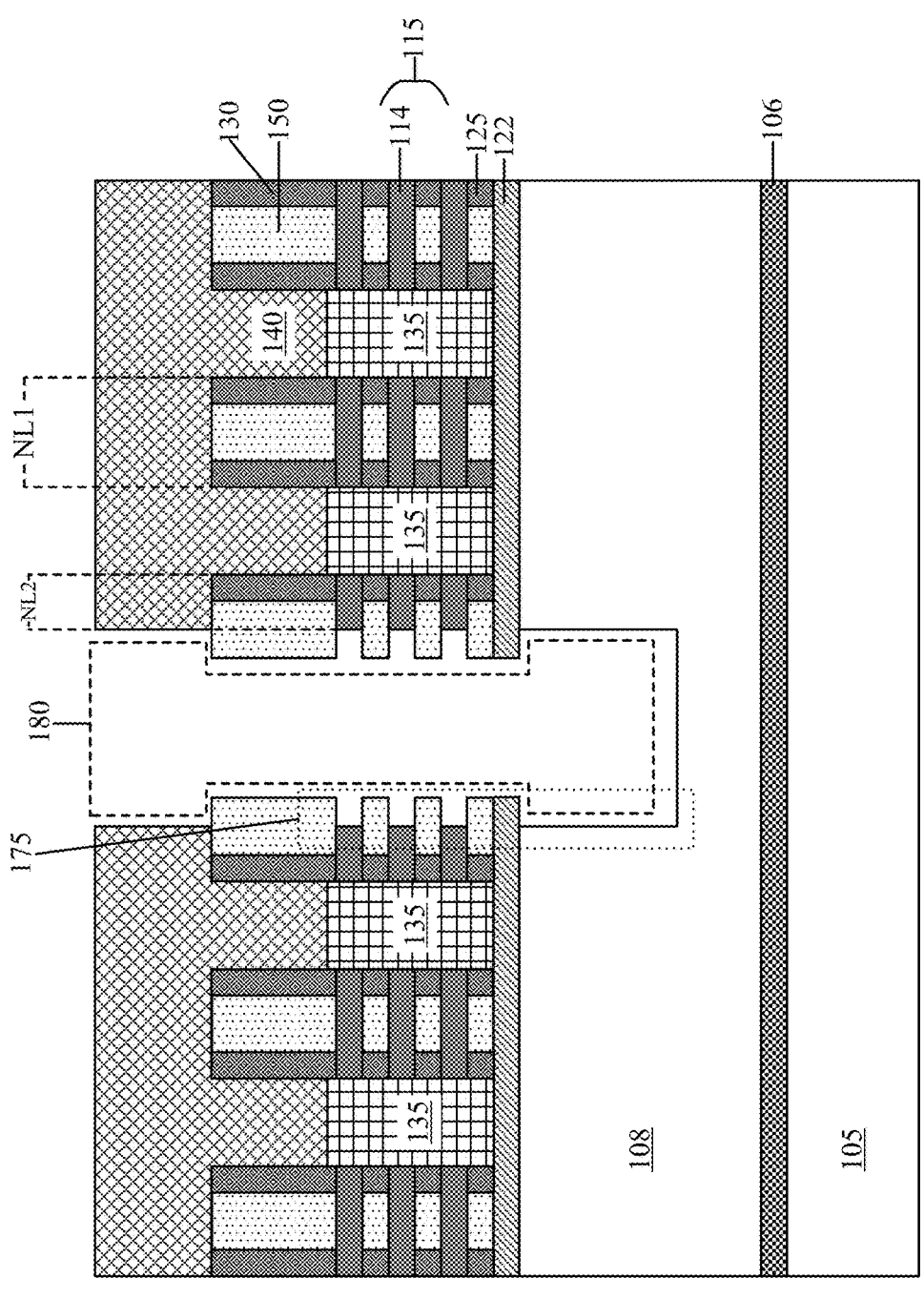
FIG. 12 illustrates a cross section X of the nano stack after recessing the channel layers and the etching of the second substrate, in accordance with the embodiment of the present invention.
Figure 13:
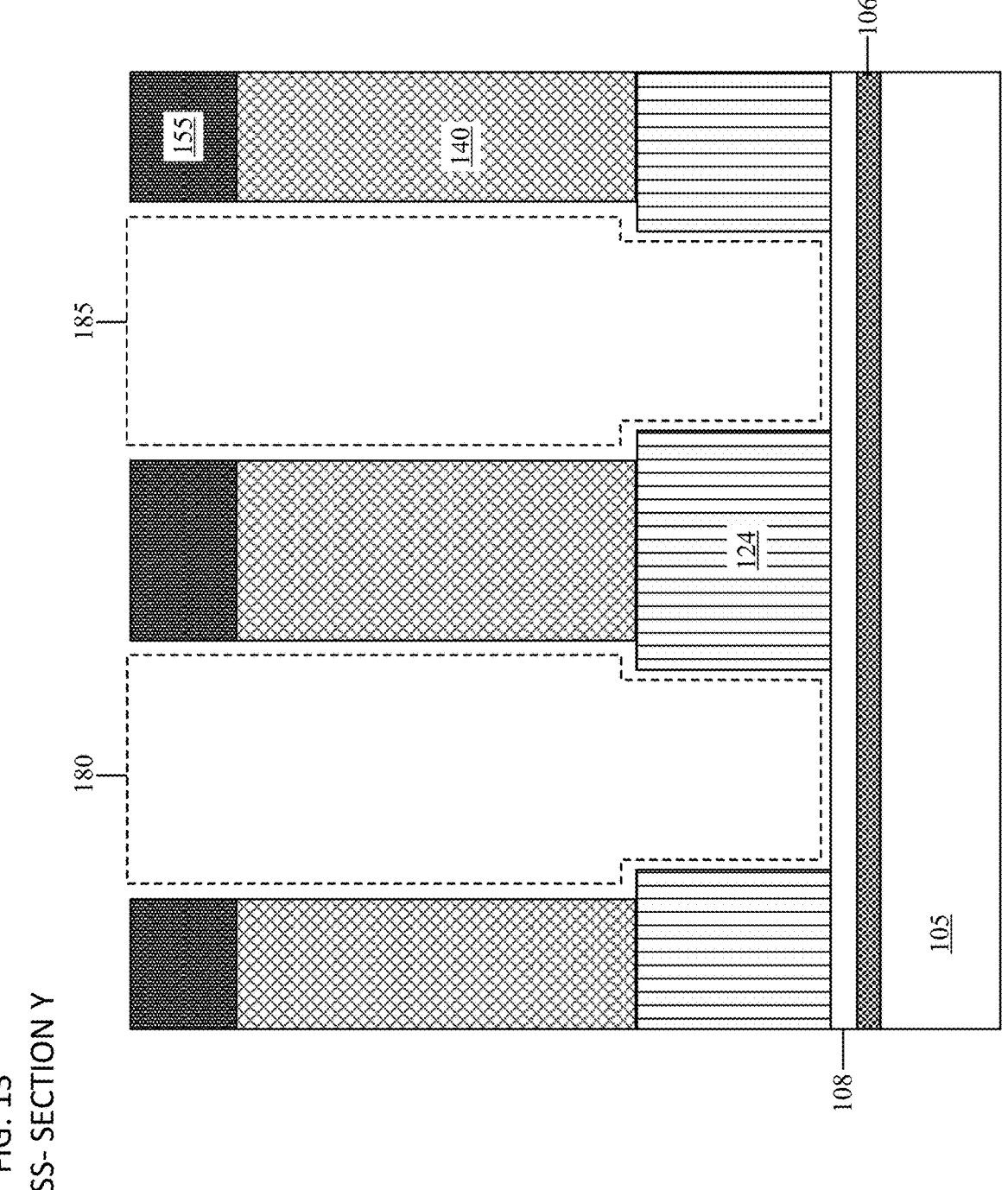
FIG. 13 illustrates a cross section Y of the source/drain region after recessing the channel layers and the etching of the second substrate, in accordance with the embodiment of the present invention.

FIGS. 12, and 13 illustrate the processing stage after recessing the channel layers 114 and the etching of the second substrate 108. The channel layers 114 exposed by the removal of the upper spacer 130 and the inner spacer 125 are recessed. The recessing of the channel layers 114 causes the gate 150 to extend past the end of the channel layers 114 as emphasized by dashed box 175. The second substrate 108 that surrounds the bottom section of the first double diffusion break trench 160 is laterally etched to increase the dimension of the trench. The recessing of the channel layers 114, and the second substrate 108, and the removal of the upper spacer 130 creates the expanded first double diffusion break trench 180. The middle section of the expanded first double diffusion break trench 180 is wider than the middle section of the first double diffusion break trench 160. Furthermore, bottom section of the expanded first double diffusion break trench 180 is wider than the bottom section of the first double diffusion break trench 160. FIG. 13 illustrates that the expanded first double diffusion break trench 180 and the expanded second double diffusion break trench 185. The channel layers 114 of the active devices have a length NL1 and the channel layers 114 of the dummy device D1 and D1 have a length NL2. The length NL2 of the channel layers 114 of the dummy devices D1, D2 is less than the length NL1 of the channel layers 114 of the active devices.

Figure 14:
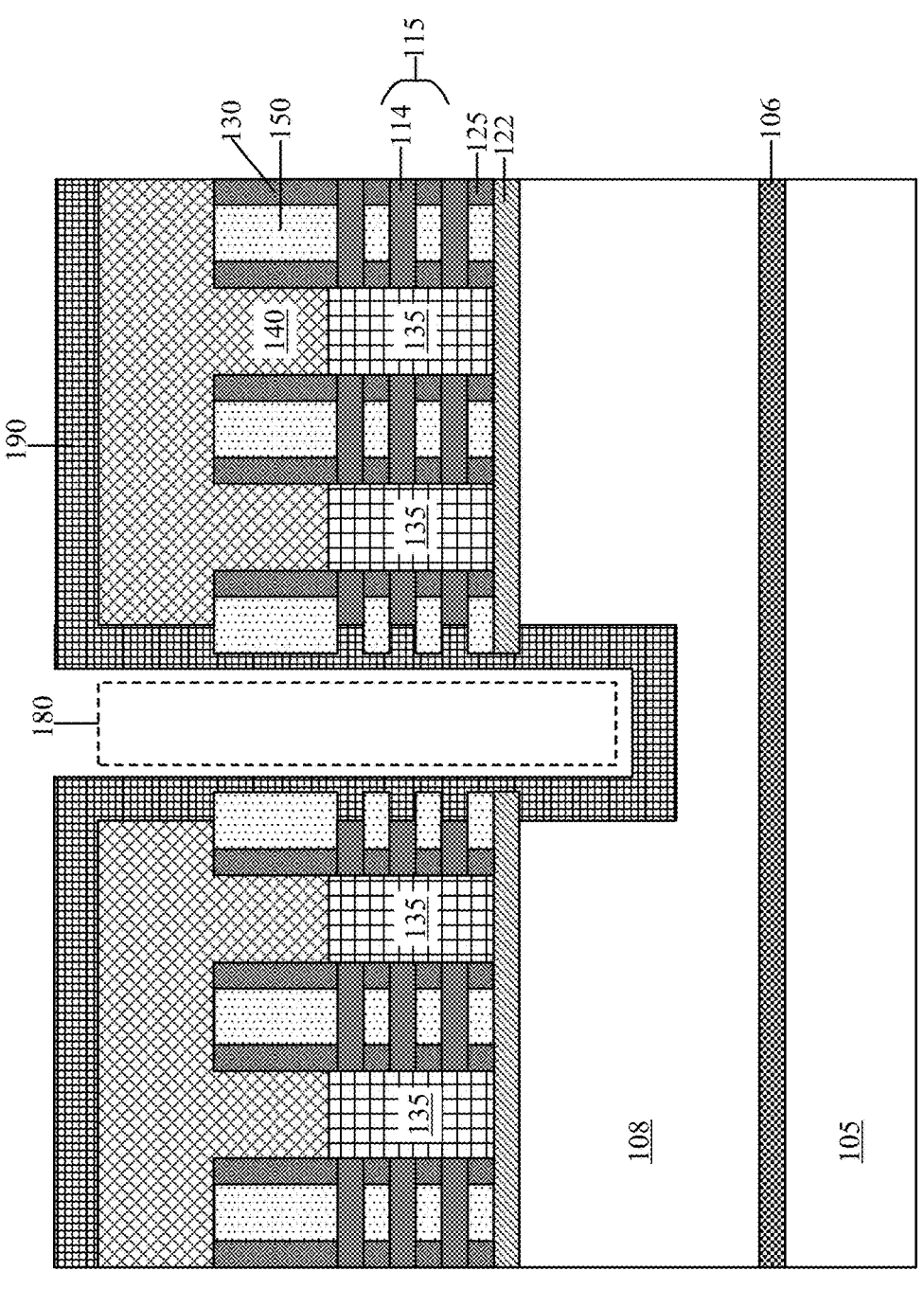
FIG. 14 illustrates a cross section X of the nano stack after formation of a new inner spacer, in accordance with the embodiment of the present invention.
Figure 15:
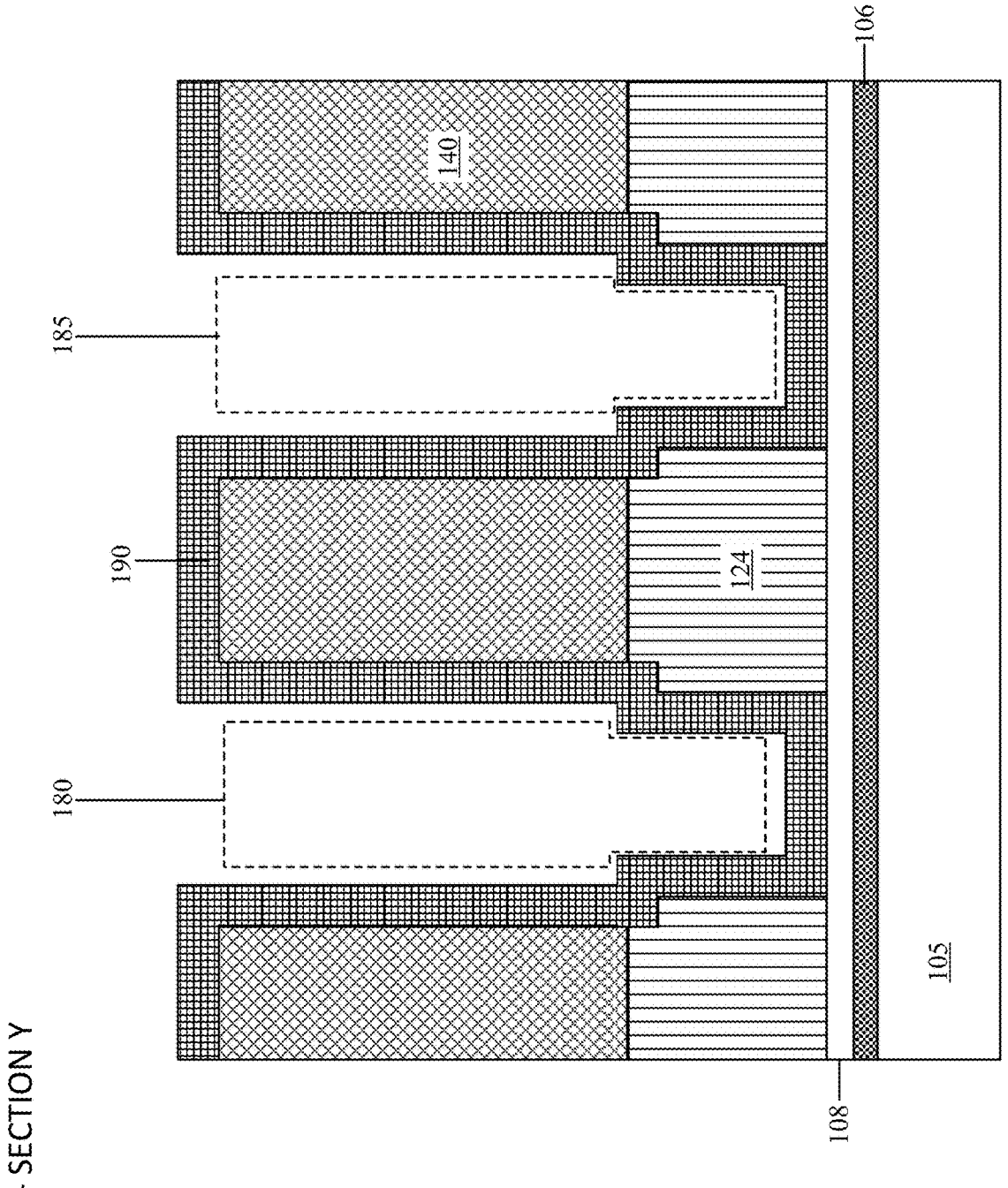
FIG. 15 illustrates a cross section Y of the source/drain region after formation of a new inner spacer, in accordance with the embodiment of the present invention.

FIGS. 14, and 15 illustrate the processing stage after formation of a new inner spacer 190. A new inner spacer 190 is formed on the exposed surfaces within the expanded first double diffusion break trench 180 and the expanded second double diffusion break trench 185. The new inner spacer 190 is also located on top of the interlayer dielectric layer 140.

Figure 16:
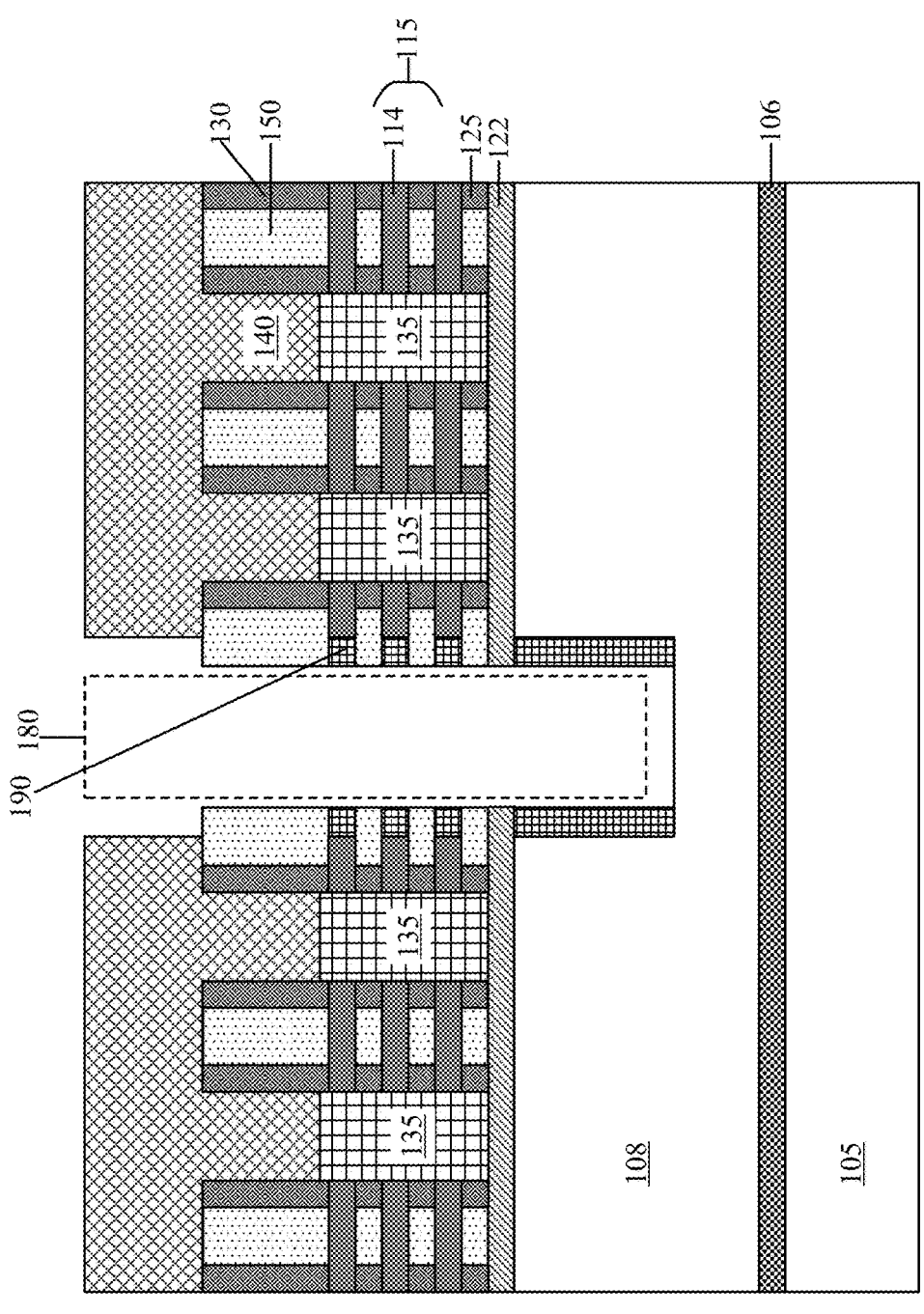
FIG. 16 illustrates a cross section X of the nano stack after etching of the new inner spacer, in accordance with the embodiment of the present invention.
Figure 17:
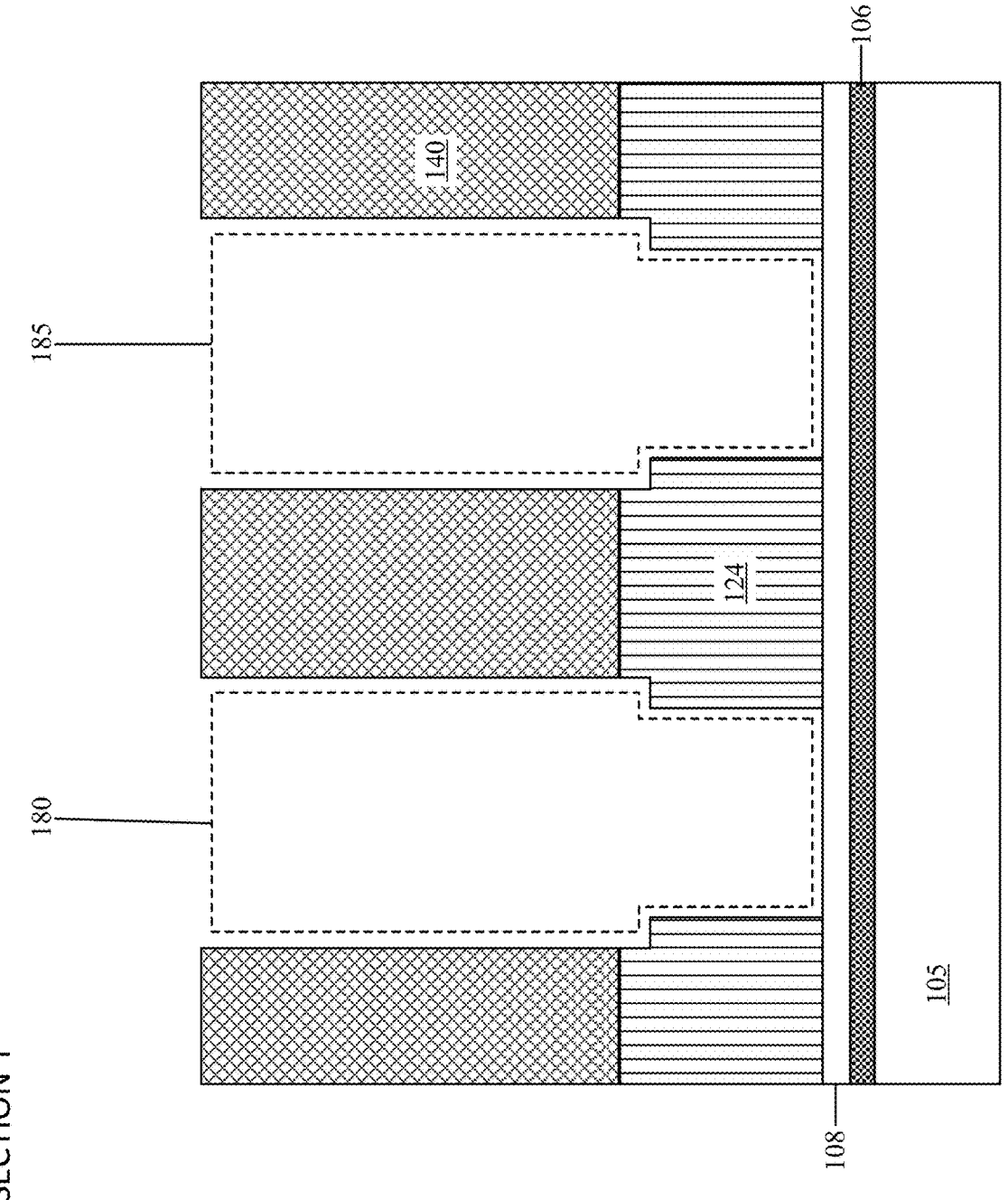
FIG. 17 illustrates a cross section Y of the source/drain region after etching of the new inner spacer, in accordance with the embodiment of the present invention.

FIGS. 16, and 17 illustrate the processing stage after etching of the new inner spacer 190. The new inner spacer 190 is etched by, for example, a reactive ion etch (RIE) to remove unwanted new inner spacer 190. After the etching process, a portion of the new inner spacer 190 remains adjacent to the channel layers 114 and between the sections of the gate 150. Additional new inner spacer 190 remains along the sidewalls of the second substrate 108 that form the wall of the expanded first double diffusion break trench 180 and the expanded second double diffusion break trench 185.

Figure 18:
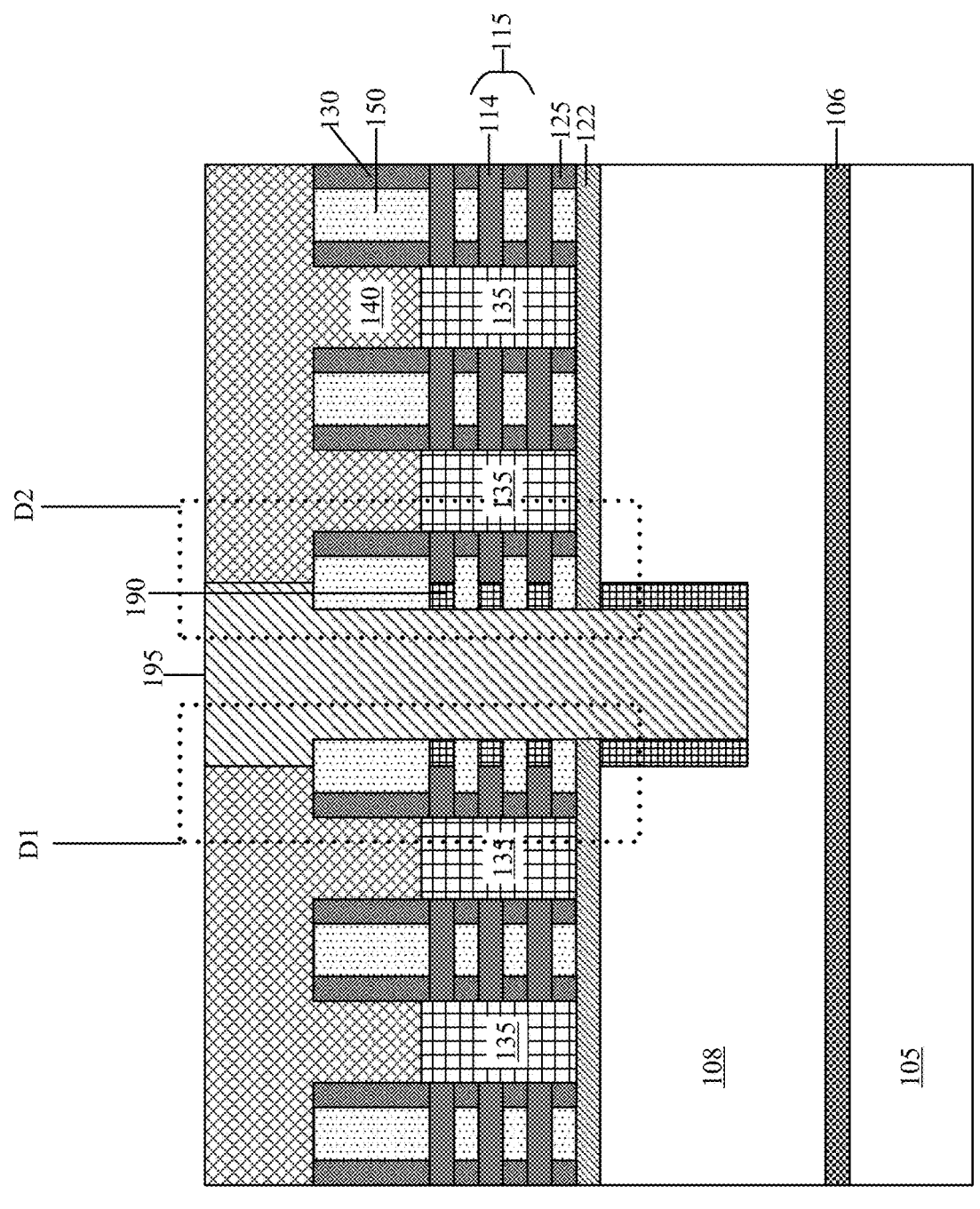
FIG. 18 illustrates a cross section X of the nano stack after formation of a Power Via, in accordance with the embodiment of the present invention.
Figure 19:
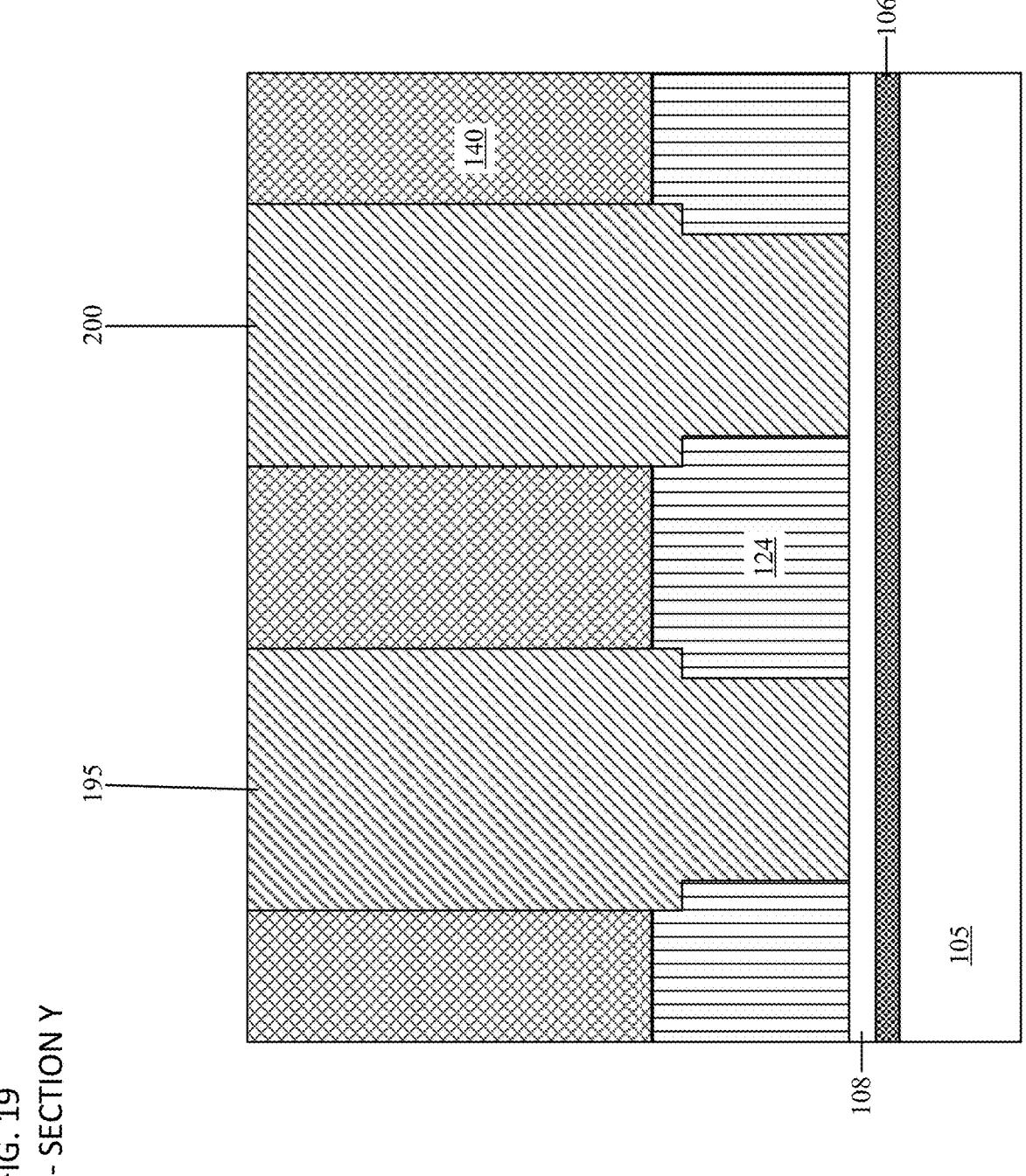
FIG. 19 illustrates a cross section Y of the source/drain region after formation of a Power Via, in accordance with the embodiment of the present invention.

FIGS. 18, and 19 illustrate the processing stage after formation of a Power Via 195, 200. The expanded first double diffusion break trench 180 and the expanded second double diffusion break trench 185 are filled in with a conductive metal to form a first Power Via 195 and a second Power Via 200. The first Power Via 195 includes a top section, a middle section, and a bottom section. The sidewalls of a middle section of the first Power Via 195 are flush against the sidewalls of the first dummy device D1 and flush against the sidewalls of the second dummy device D2. The top section of the first Power Via 195 overlaps with a portion of the gate 150, e.g., the top section of the first Power Via 195 is located on top of the gate 150. The sidewalls of a bottom section of the first Power Via 195 are flush against the new inner spacer 190. Furthermore, a bottom surface of the bottom section of the first Power Via 195 is flush against the second substrate 108. The width of the first Power Via 195 is substantially constant across the middle section and the bottom section, while the top section of the first Power Via 195 is wider than the middle section and the bottom section. As illustrated in FIG. 18, the first Power Via 195 in cross section X has a shape of a bolt, i.e., a head portion (i.e., the top section) and a shaft portion (i.e., the middle and bottom section). FIG. 19 illustrates the first Power Via 195 and the second Power Via 200 as separate elements, but based on designed these separated elements can be combined to form a single power via that extends across multiple devices.

By reducing the width of the first dummy device D1 and the width of the second dummy device D2 allows for an increase in the width of the first double diffusion break trench 160 to create the expanded first double diffusion break trench 180. If the first double diffusion break trench 160 is filled with a conductive metal to form a Power Via (not shown), then the middle section of the Power Via will have a first width. However, since the first double diffusion break trench 160 is widened to form the expanded the first double diffusion break trench 180, then the middle section of the Power Via 195 has a second width, where the second width is larger than the first width. The larger width (i.e., the second width) causes a reduction of the resistance of the Power Via 195 when compared to a resistance of a power via have a smaller width (i.e., the first width).

Figure 20:
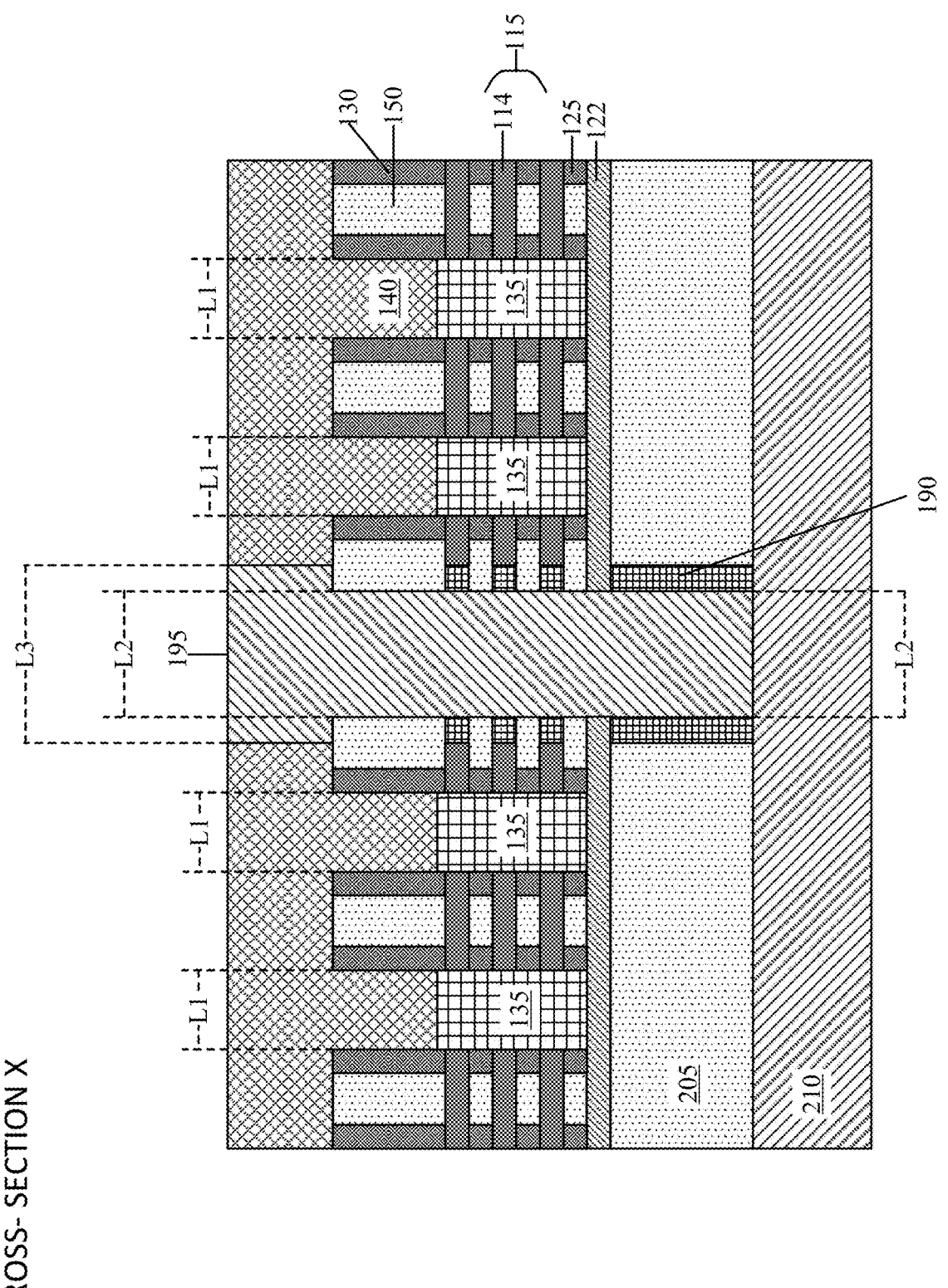
FIG. 20 illustrates a cross section X of the nano stack after formation of a backside interlayer dielectric layer and a plurality of metal lines, in accordance with the embodiment of the present invention.
Figure 21:
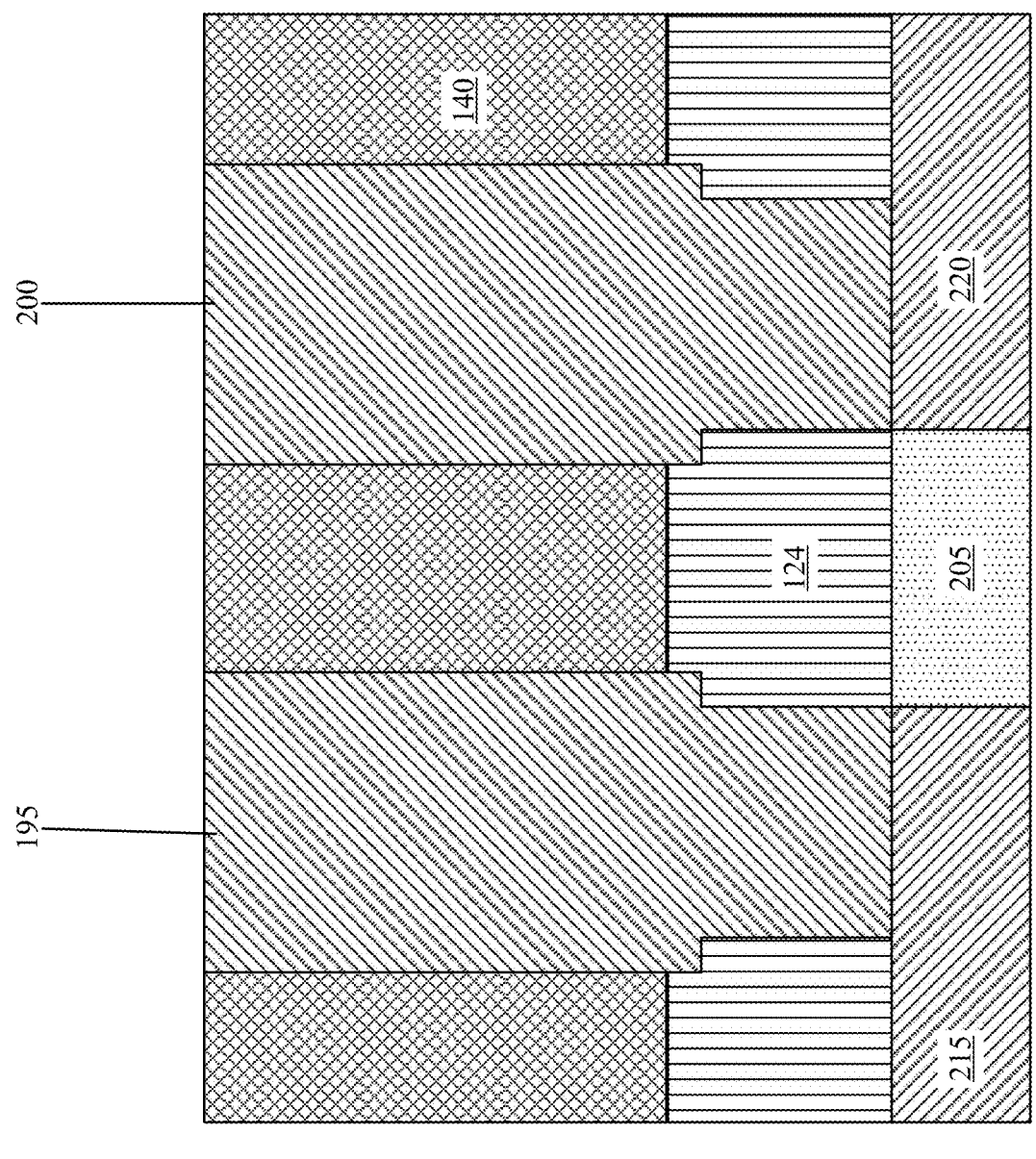
FIG. 21 illustrates a cross section Y of the source/drain region after formation of a backside interlayer dielectric layer and a plurality of metal lines, in accordance with the embodiment of the present invention.

FIGS. 20, and 21 illustrate the processing stage after formation of a backside interlayer dielectric layer 205 and a plurality of metal lines 210, 215, 220. A back-end-of-line layer (not shown) and a carrier wafer (not shown) are formed on top of the interlayer dielectric layer 140 and on top of the first Power Via 195 and the second Power Via 200. The device is flipped over (not shown) for the backside processing. The first substrate 105, the etch stop 106 and the second substrate 108 are removed. A backside interlayer dielectric layer 205 is formed, where the new inner spacer 190 is located between the backside interlayer dielectric layer 205 and the first Power Via 195, as seen in FIG. 20. A first metal line 210, for example, a backside-power-rail, is formed on the backside interlayer dielectric layer 205 and in contact with a backside surface of the first Power Via 195. FIG. 21 illustrates a formation of a second metal line 215 and a third metal line 220. The second metal line 215, for example, a VDD rail, is connected to a bottom surface of the first Power Via 195. The third metal line 220, for example, a VSS rail, is connected to a bottom surface of the second Power Via 200. As illustrated in FIG. 20, the length L1 is the distance between adjacent nano columns, where the length L1 is the source/drain region for the devices. The length is measure as the distance that is perpendicular to the gate 150. The top section of the first Power Via 195 has a length L2. The middle section and bottom section of the first Power Via 195 has a length of L2. The length L2 of the middle section and bottom section of the first Power Via 195 is greater than the length L1 between the adjacent nano columns. The length L3 of the top section of the first Power Via 195 is greater than the length L2 of the middle and bottom section of the first Power Via 195.

Figure 22:
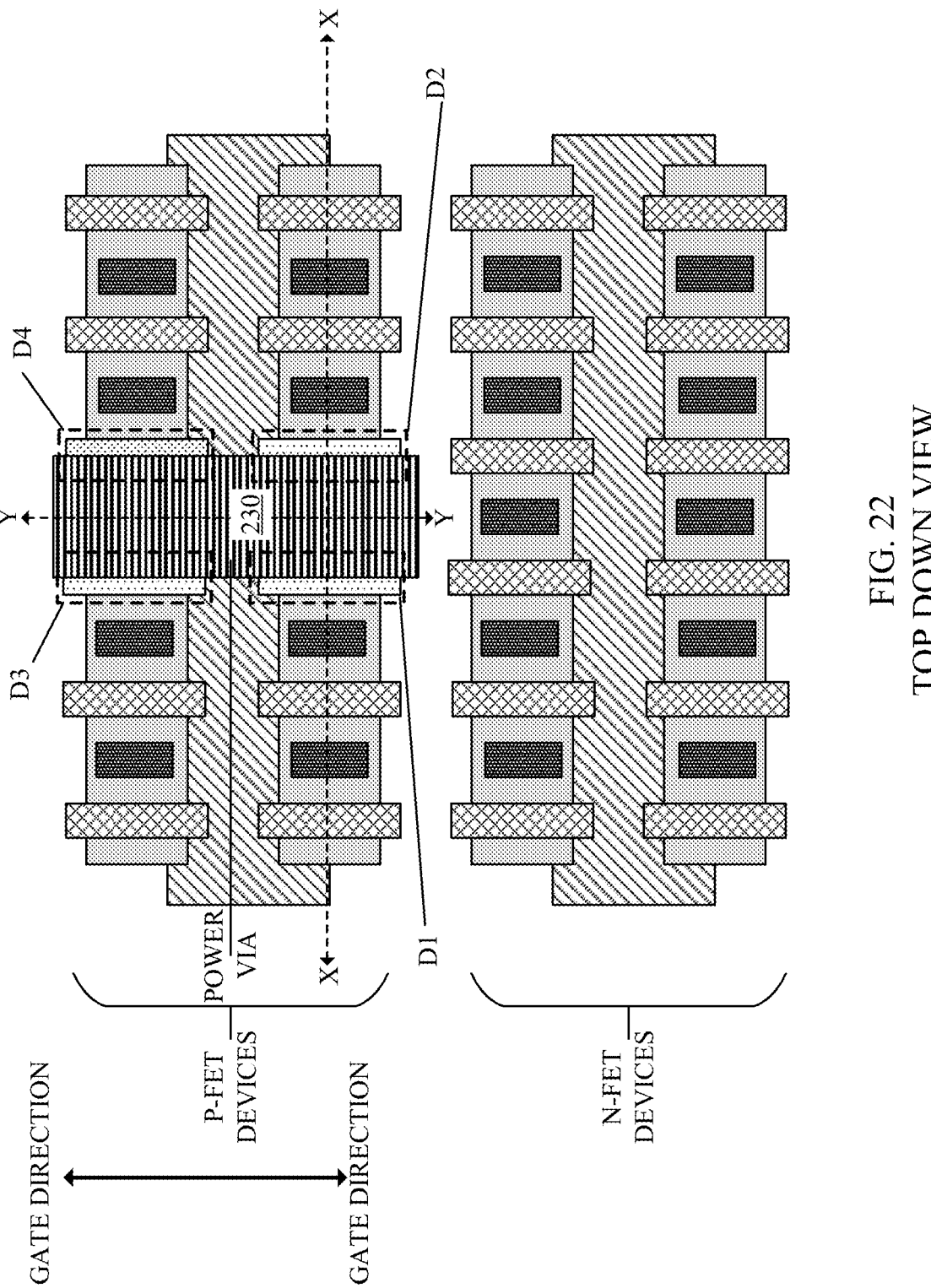
FIG. 22 illustrates a top-down view of multiple nano devices/nanosheet transistors having a power via that extends across multiple transistors, in accordance with the embodiment of the present invention.

FIG. 22 illustrates a top-down view of multiple devices, in accordance with the embodiment of the present invention. The cross-section X extends horizontally through the nano stacks of one of the devices. Cross section Y is perpendicular to cross section X, where cross section Y is through a source/drain region that spans across multiple nano stacks. FIG. 1 illustrates two different power vias having different characteristics. A single power via or a shared power via extends across adjacent transistors.

Figure 23:
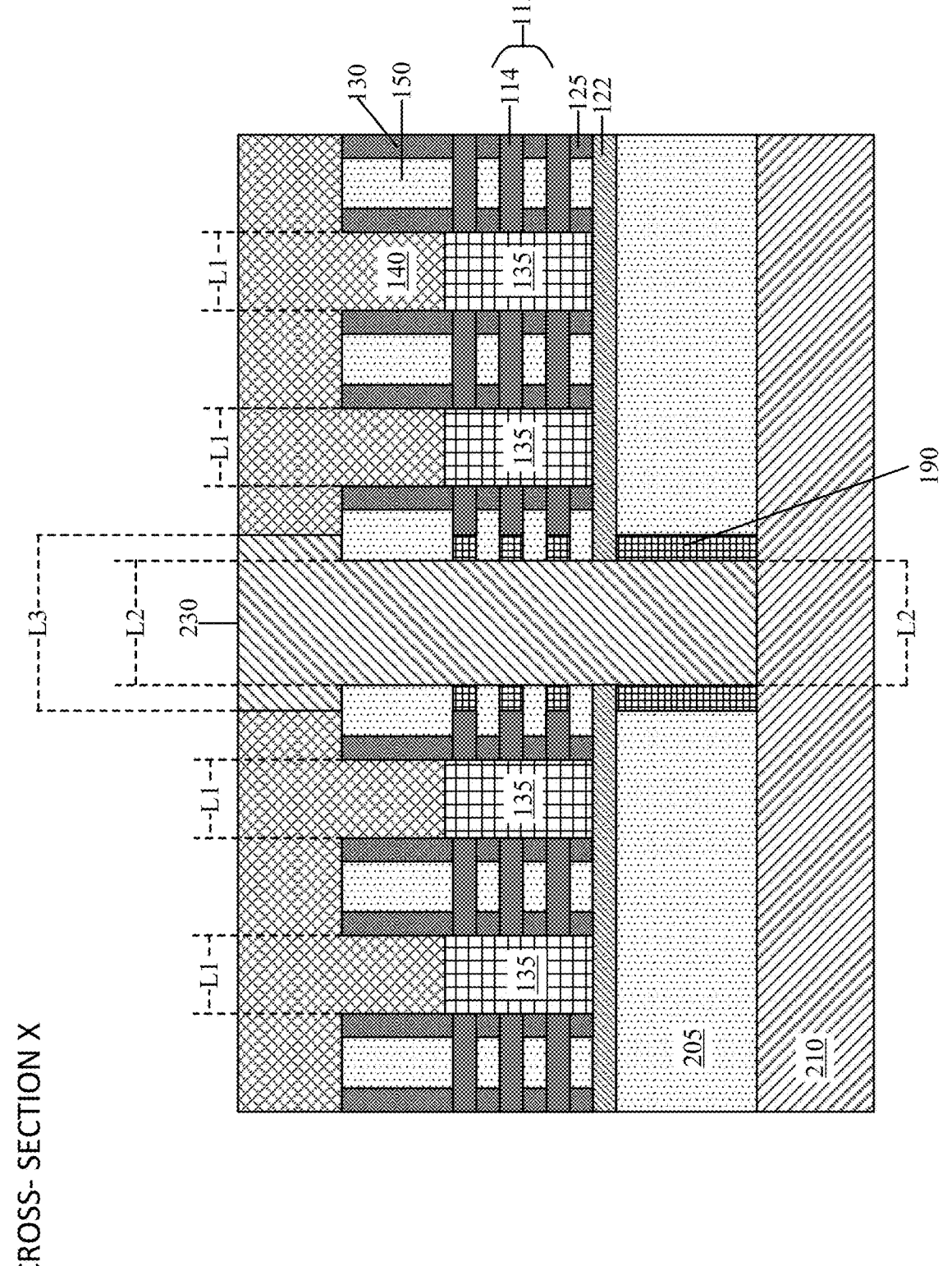
FIG. 23 illustrates a cross section X of the nano stack after formation of a backside interlayer dielectric layer and a plurality of metal lines, in accordance with the embodiment of the present invention.
Figure 24:
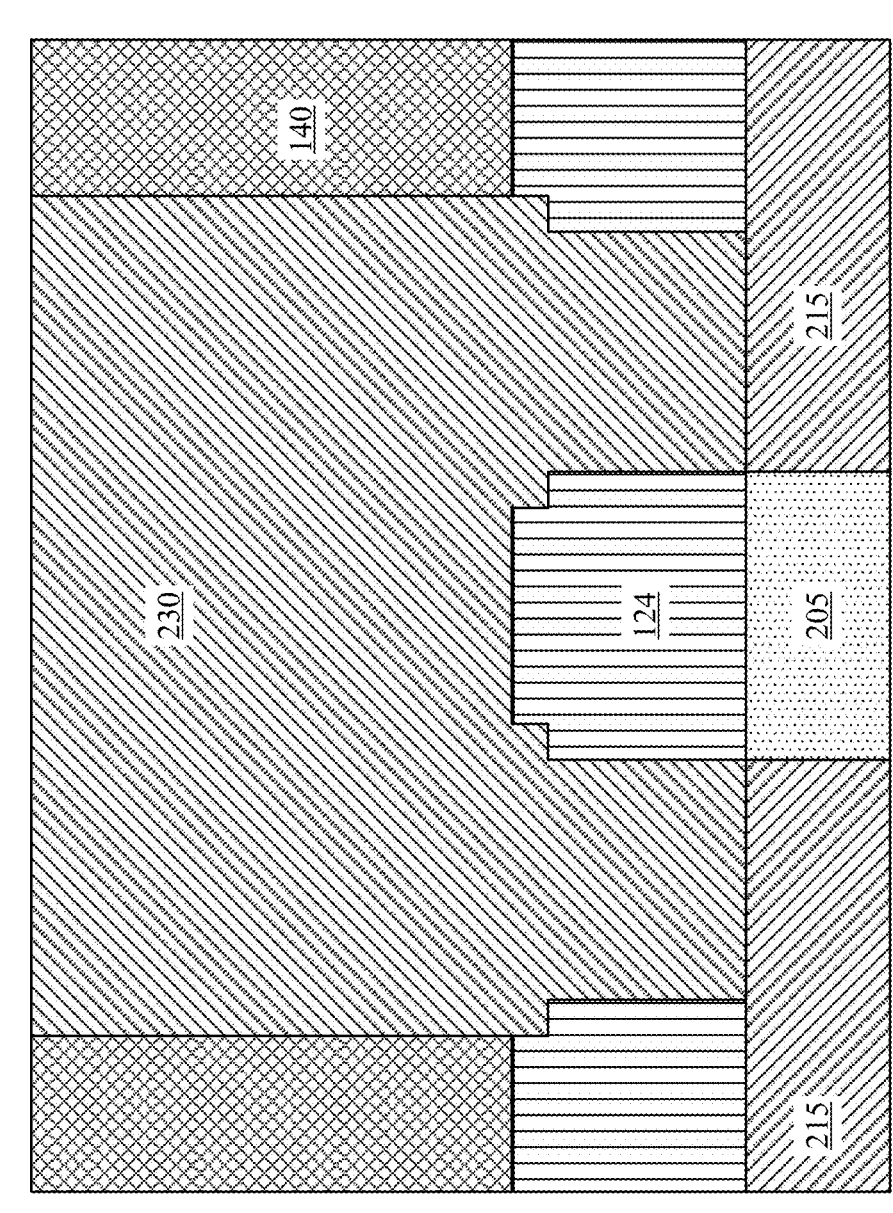
FIG. 24 illustrates a cross section Y of the source/drain region after formation of a backside interlayer dielectric layer and a plurality of metal lines, in accordance with the embodiment of the present invention.

FIGS. 23, and 24 illustrate the processing stage after formation of a backside interlayer dielectric layer 205 and a plurality of metal lines 210, 215, 220 for when a shared power via 230 is utilized. FIG. 23 is similar to the description of FIG. 20, so the description will not be repeated. The difference is that a shared power via 230 is formed instead of the first power via 195 and the second power via 200. As illustrated in FIGS. 22 and 24 the shared power via 230 extends in the gate direction to be located adjacent to dummy devices in different transistors. The shared power via 230 is in contact with at least four different dummy devices (D1, D2, D3 and D4). FIG. 22 illustrates that the shared power via extends across two P-FET transistors.

Alternatively, the shared power via 230 can extend across two adjacent N-FET transistors (not shown). The final design of the device can have one ore more shared power vias, single power vias (e.g., first power via 195, or second power via 200, where width of the power vias can be larger, smaller or equal to the width of the transistor in the gate direction), or any combination power vias thereof.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
a plurality of nanosheet transistors, wherein each of the plurality of nanosheet transistors includes an active gate located around a plurality of active channel layers, wherein each of the plurality of nanosheet transistors includes a source/drain region having a first length, wherein the first length is measured perpendicular to a gate direction of the plurality of nanosheet transistors; and
a power via located between a first dummy device and a second dummy device, wherein the power via has a second length, wherein the second length is measured perpendicular to the gate direction of the plurality of nanosheet transistors, wherein the second length is larger than the first length, wherein each of the first dummy device and the second dummy device includes a gate, a plurality of channel layers, and an inner spacer, respectively.

2. The microelectronic structure of claim 1, wherein the power via includes a top section, a middle section, and a bottom section.

3. The microelectronic structure of claim 2, wherein the top section has a third length, wherein the third length is measured perpendicular to the gate direction of the plurality of nanosheet transistors, wherein the third length is larger than the second length.

4. The microelectronic structure of claim 3, wherein the power via has a shape of a bolt.

5. The microelectronic structure of claim 4, wherein a length of the middle section and the bottom section is the second length.

6. The microelectronic structure of claim 5, further comprising:
a spacer located adjacent to sidewalls of the bottom section of the power via, wherein the spacer extends along a height of the bottom section; and
a metal line connected to a bottom surface of the bottom section of the power via.

7. The microelectronic structure of claim 6, wherein the first dummy device and the second dummy devices are each comprised of a gate, a plurality of dummy channel layers, and an inner spacer, wherein each of the plurality of active channel layers has a first channel length, and each of the plurality of dummy channel layers has a second channel length, wherein the first and second channel length are measured perpendicular to the gate direction of the plurality of nanosheet transistors, wherein the second channel length is smaller than the first channel length.

8. The microelectronic structure of claim 1, wherein the power via has a first width as measured parallel to the gate direction of the plurality of nanosheet transistors, wherein the each of the plurality of transistors has a second width as measured parallel to the gate direction of the plurality of nanosheet transistors, wherein the first width is larger than the second width.

9. A microelectronic structure comprising:
a plurality of nanosheet transistors, wherein each of the plurality of nanosheet transistors includes an active gate located around a plurality of active channel layers, wherein each of the plurality of nanosheet transistors includes a source/drain region having a first length, wherein the first length is measured perpendicular to a gate direction of the plurality of nanosheet transistors; and
a power via located between a first dummy device and a second dummy device, wherein the power via has a second length, wherein the second length is measured perpendicular to the gate direction of the plurality of nanosheet transistors, wherein the second length is larger than the first length, wherein the first dummy device is located flush against a first side of the power via and the second dummy device is located flush against a second side of the power via, wherein each of the first dummy device and the second dummy device includes a gate, a plurality of channel layers, and an inner spacer, respectively.

10. The microelectronic structure of claim 9, wherein the power via includes a top section, a middle section, and a bottom section.

11. The microelectronic structure of claim 10, wherein the top section has a third length, wherein the third length is measured perpendicular to the gate direction of the plurality of nanosheet transistors, wherein the third length is larger than the second length.

12. The microelectronic structure of claim 11, wherein the power via has a shape of a bolt.

13. The microelectronic structure of claim 12, wherein a length of the middle section and the bottom section is the second length.

14. The microelectronic structure of claim 13, further comprising:
a spacer located adjacent to sidewalls of the bottom section of the power via, wherein the spacer extends along a height of the bottom section; and
a metal line connected to a bottom surface of the bottom section of the power via.

15. The microelectronic structure of claim 14, wherein the first dummy device and the second dummy devices are each comprised of a gate, a plurality of dummy channel layers, and an inner spacer, wherein each of the plurality of active channel layers has a first channel length, and each of the plurality of dummy channel layers has a second channel length, wherein the first and second channel length are measured perpendicular to the gate direction of the plurality of nanosheet transistors wherein the second channel length is smaller than the first channel length.

16. The microelectronic structure of claim 9, wherein the power via has a first width as measured parallel to the gate direction of the plurality of nanosheet transistors, wherein the each of the plurality of transistors has a second width as measured parallel to the gate direction of the plurality of nanosheet transistors, wherein the first width is larger than the second width.

17. The microelectronic structure of claim 9, wherein the power via is a shared power via that extends across at least two nanosheet transistors, wherein the shared power via is located additionally between a third dummy device and a fourth dummy device.

* * * * *